United States Patent
Li et al.

(10) Patent No.: US 7,948,199 B2
(45) Date of Patent: May 24, 2011

(54) SINGLE-ENDED GAIN STAGE AND DISK DRIVE

(75) Inventors: Qunying Li, Allen, TX (US); Juergen Luebbe, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 356 days.

(21) Appl. No.: 12/130,631

(22) Filed: May 30, 2008

(65) Prior Publication Data

US 2008/0297253 A1    Dec. 4, 2008

Related U.S. Application Data

(60) Provisional application No. 60/941,345, filed on Jun. 1, 2007, provisional application No. 60/952,378, filed on Jul. 27, 2007.

(51) Int. Cl.
*G05F 1/10* (2006.01)
(52) U.S. Cl. ........ 318/650; 318/638; 318/560; 330/254; 330/258
(58) Field of Classification Search .................. 318/650, 318/638, 560
See application file for complete search history.

(56) References Cited

U.S. PATENT DOCUMENTS

| | | | | |
|---|---|---|---|---|
| 5,481,225 A * | 1/1996 | Lumsden et al. | ............. | 330/254 |
| 6,470,412 B1 * | 10/2002 | Kisaka et al. | ...................... | 711/4 |
| 6,556,077 B2 * | 4/2003 | Schaffer et al. | .................. | 330/69 |
| 6,864,656 B2 * | 3/2005 | Abe et al. | ....................... | 318/560 |
| 7,138,873 B2 * | 11/2006 | Chandra et al. | ............... | 330/303 |

* cited by examiner

*Primary Examiner* — Walter Benson
*Assistant Examiner* — David S Luo
(74) *Attorney, Agent, or Firm* — Dawn V. Stephens; Wade James Brady, III; Frederick J. Telecky, Jr.

(57) ABSTRACT

An electrical apparatus comprising an amplifier having a first input, a second input, and an output. The apparatus further comprises a first electrical path coupled to the first input and having a first resistance and a first electrical path coupled to the second input and having a second resistance. The apparatus further comprises a second electrical path coupled to the second input and having a third resistance and a second electrical path, comprising an electrically-controllable resistance, coupled between the output and the first input. Further, the apparatus comprises circuitry for controlling the electrically-controllable resistance for adjusting a ratio between the electrically-controllable resistance and the third resistance to approximate a ratio between the first resistance and the second resistance.

25 Claims, 10 Drawing Sheets

US 7,948,199 B2

SINGLE-ENDED GAIN STAGE AND DISK DRIVE

CROSS-REFERENCES TO RELATED APPLICATIONS

This application claims priority to, the benefit of the filing date of, and hereby incorporates herein by reference, U.S. Provisional Patent Application 60/941,345, entitled "The Trim Circuit and Method for CMRR Improvement On A Single-Ended Gain Stage," and filed Jun. 1, 2007.

This application claims priority to, the benefit of the filing date of, and hereby incorporates herein by reference, U.S. Provisional Patent Application 60/952,378, entitled "The Trim Circuit and Method for CMRR Improvement On A Single-Ended Gain Stage," and filed Jul. 27, 2007.

STATEMENT REGARDING FEDERALLY SPONSORED RESEARCH OR DEVELOPMENT

Not Applicable.

BACKGROUND OF THE INVENTION

The preferred embodiments are in the field of amplifier gain stages and are more specifically directed to a single-ended gain stage such as for use with a disk drive and related data or computing system.

A gain stage is known for providing an output signal that may used for various purposes, where one example is a single-ended output, that is, only one voltage output based on a differential input. Both as context and as an example for a preferred embodiment, such a single-ended output of a gain stage may be used in the control loop for a disk drive so as to impart energy to the motor that positions the read/write head(s) of the drive. In the computing art, such a motor is sometimes referred to as a voice coil motor ("VCM") and the control loop is typically a part of an integrated circuit, sometimes referred to as a servomotor (or, abbreviated "servo") control. Particularly, the servo control loop provides a feedback based on the sensed current through the VCM, where that current may provide an indication of one or both of the VCM position or speed and it is therefore "sensed" by a gain stage that is often referred to as a sense amplifier.

The sense amplifier described above may be implemented in various forms, but typically the amplifying circuitry (e.g., transistors) that implement it are susceptible to common mode rejection. Specifically, and due at least in part to a lack of ideal characteristics of its differential amplifying circuitry, the sense amplifier not only has a gain (e.g., $A_d$) that amplifies its intended differential input signal, it also has a gain (e.g., $A_c$) that amplifies any signal variations in the signal that is common to both of its differential inputs. In other words, there is a phenomenon of amplifying the inputs signals that are common to both inputs, and the ability of an amplifier system to reject those common signals is referred to as a common mode rejection ratio ("CMRR"). Further, therefore, in certain applications it is desirable to reduce the CMRR, and since CMRR is typically defined in terms of decibels as $$CMRR = 20\log_{10}\left|\frac{A_d}{A_c}\right|,$$

then a change in 20 dB corresponds to a change in the ratio of $A_d$ to $A_s$ of 10. Thus, an improvement in CMRR is represented by an increase in the absolute value of the CMRR; for example, for a system with a 60 dB CMRR, it may be desirable to improve the CMRR of the system by increasing that ratio to 80 dB.

The sense amplifier described above also is typically implemented in one of various known differential input single output configurations wherein resistor combinations are used to establish the overall gain of the sense amplifier configuration. In these configurations, it is also known in the art that a mismatch in the resistance of the resistors used in the configuration, or in the ratio of such resistance, also affects the common mode introduced into the input of the amplifier (and, hence, affecting the intended output signal).

In view of the preceding, the prior art endeavors to adjust the resistance of the resistors used in the gain stage configuration so as to reduce the CMRR of the stage. In this regard, and as also discussed later, the matching of resistance for certain of those resistors must be increased to realize a corresponding improvement in CMRR. For example, to improve CMRR by 20 dB, the matching level of these certain resistors needs to be improved by a factor of 10. Typically, resistor matching level is usually proportional to $1/\sqrt{WL}$, where W and L are respectively the width and the length of the resistor as formed as a semiconductor (e.g., polysilicon) region in an integrated circuit. Therefore, to achieve a denominator of 10 in the value of $1/\sqrt{WL}$ the product of WL must equal 100. In other words, either or both the width and the length of the resistor must be vastly increased, which results in a greatly increased area for the entire sense amplifier configuration. As known in the art, such a large increase in area is undesirable for many reasons. For example, an increase in the circuit affects the cost and size of the circuit as well as the device, such as a magnetic disk drive, in which the circuit is used.

Given the preceding, the preferred embodiments seek to improve upon the prior art, as demonstrated below. And, by improving upon the prior art, improved CMRR may be achieved in a gain stage without a large increase in the gain stage circuit size, thereby facilitating a lower cost and device size for the circuit and device in which the circuit is used. In this regard, magnetic disk drives are used over a wide range of electronic systems, including large-scale network servers, desktop computers and workstations, portable computers (e.g., laptops), and now even in modern handheld devices such as portable digital audio players. Accordingly, a decrease in size positively affects cost in such systems, and it also permits even further uses the use of drives in smaller equipment, including the above-mentioned audio players and with likely additional applications in the future.

BRIEF SUMMARY OF THE INVENTION

In the preferred embodiment, there is an electrical apparatus. The apparatus comprises an amplifier having a first input, a second input, and an output. The apparatus further comprises a first electrical path coupled to the first input and having a first resistance and a first electrical path coupled to the second input and having a second resistance. The apparatus further comprises a second electrical path coupled to the second input and having a third resistance and a second electrical path, comprising an electrically-controllable resistance, coupled between the output and the first input. Further, the apparatus comprises circuitry for controlling the electrically-controllable resistance for adjusting a ratio between the electrically-controllable resistance and the third resistance to approximate a ratio between the first resistance and the second resistance.

Other aspects are also disclosed and claimed.

DETAILED DESCRIPTION OF THE INVENTION

The inventive scope is described by way of example below in connection with a preferred embodiment as implemented into a magnetic disk drive used in connection with a computer system. However, other preferred embodiments, including overall systems, may receive significant benefit with disk drives or other apparatus constructed per the teachings of this document. Accordingly, it is to be understood that the following description is provided by way of example only and is not intended to limit the inventive scope.

Figure 1:
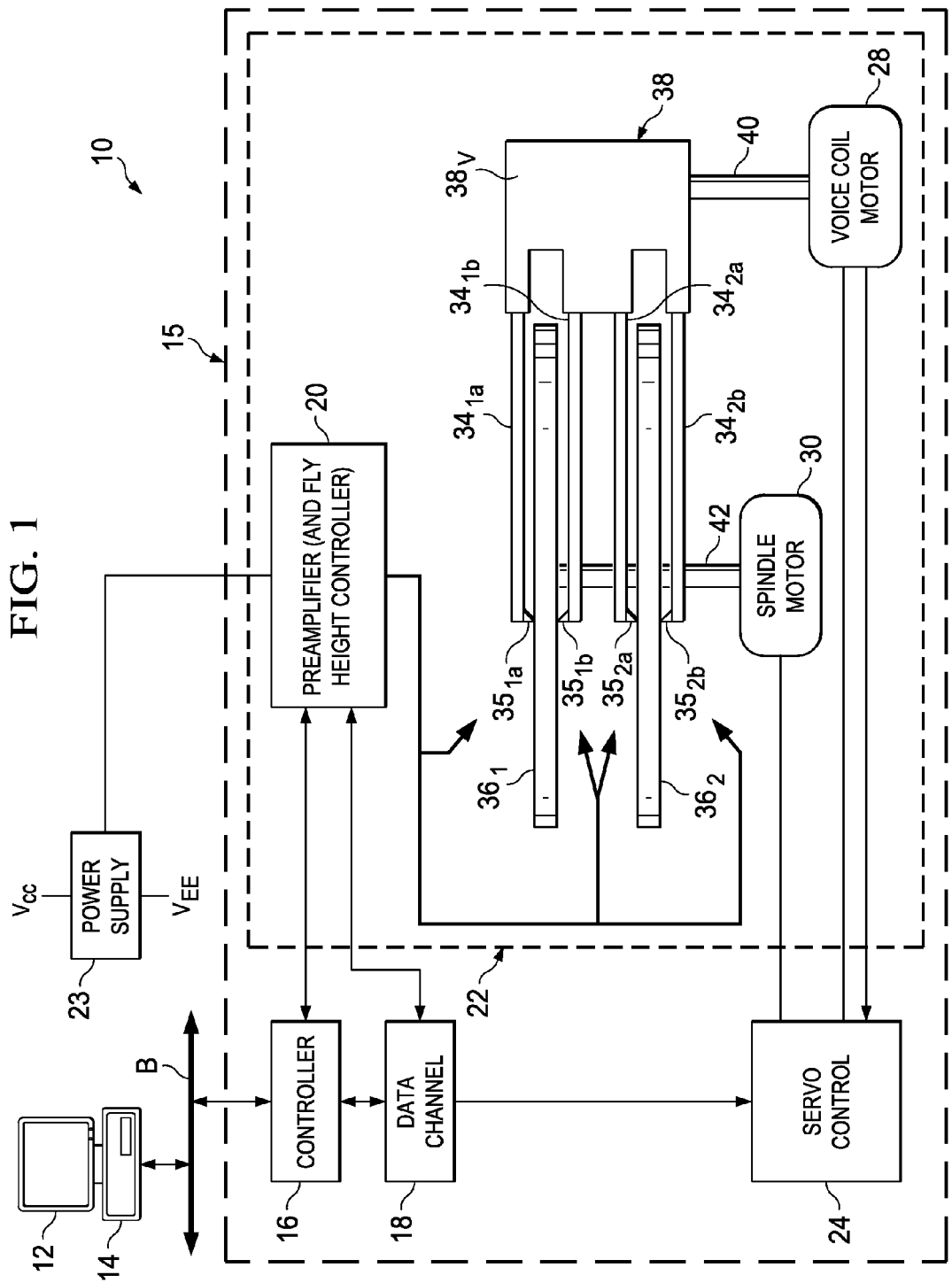
FIG. 1 illustrates an example of a computer system 10 into which a preferred embodiment may be implemented.

FIG. 1 illustrates a functional and electrical block diagram of an example of a computer system 10 into which a preferred embodiment is implemented. Certain aspects of system 10 are known in the art, but overall the system is improved by additional aspects detailed later. In the FIG. 1 example, system 10 includes a computer 12, realized in many ways in the conventional manner. For example, but not explicitly illustrated in FIG. 1, computer 12 includes a central processing unit ("CPU"), random access memory ("RAM"), video, sound cards or functionality, network interface capability, and the like. Computer 12 also includes a host adapter 14, which connects on one side to an internal system bus (not shown) of computer 12 and on the other side to a bus B. Bus B is preferably implemented according to conventional standards, examples of which include the Enhanced Integrated Drive Electronics ("EIDE") standard or the Small Computer System Interface ("SCSI") standard. Bus B, either directly or via an interface (e.g., interface adapter), is also connected to a disk drive assembly 15 and more particularly to a disk drive controller 16 of assembly 15. While not shown, other disk storage devices (e.g., hard disk controllers, floppy drive controllers, etc.) and other peripherals also may be connected to bus B, as desired and in a conventional manner.

Controller 16 is a conventional disk drive controller as known in the art. In modern disk drives in which the drive electronics are implemented at the disk drive rather than as a controller at computer 12 itself, controller 16 is implemented in connection with a printed circuit board within disk drive 15. Of course, in larger scale systems, controller 16 may be implemented within computer 12. In the generalized block diagram of FIG. 1, controller 16 as well as the other components of drive 15 are shown according to their functions, rather than their physical integrated circuits, for the sake of clarity. Typical integrated circuits used to implement disk drive controllers such as controller 16 include a digital signal processor ("DSP"), read-only memory ("ROM") and RAM, other non-volatile storage such as flash RAM, interface circuitry connected to bus B, and other custom logic circuitry. Controller 16 is connected to a data channel 18 and also to a preamplifier (and possibly fly height controller) 20 of a hard disk assembly 22. Preamplifier 20 is shown in FIG. 1 in schematic block form and is preferably a single integrated circuit that may be located within the drive in various locations. Preamplifier 20, which receives power from rails of $V_{CC}$ and $V_{EE}$ via a power supply 23, controls the reading or writing of data with respect to the storage media, where more particularly in this regard preamplifier 20 provides appropriate signals via traces to one or more read/write head sensor assemblies $35_x$, and where each such assembly $35_x$ is supported at a position near either an upper or lower surface of a respective disk $36_x$; in the example of FIG. 1, two such disks $36_1$, and $36_2$ are shown as the storage media, with disk $36_1$ having respective sensor assemblies $35_{1a}$ and $35_{1b}$, and disk $36_2$ having respective assemblies $35_{2a}$ and $35_{2b}$. Each assembly $35_x$ extends from a respective arm $34_x$ of a common movable member or actuator referred to as a so-called E-block 38, which gets its name because its cross section has roughly an "E" shape in that, in the perspective shown in FIG. 1, there is a vertical section $38_V$ and then extending from that section is a horizontal upper arm supporting assembly $34_{1a}$, horizontal middle arm supporting assemblies $34_{1b}$ and $34_{2a}$, and a horizontal lower assembly supporting assembly $34_{2b}$. In any event, the supporting arms $34_x$ support a respective sensor assembly $35_x$ so that each such assembly is proximate a surface of one of the disks and therefore for reading data from and writing to the disks $36_1$ and $36_2$, where these disks thereby serve as the storage media of hard disk assembly 22.

Returning to data channel 18, note that it communicates with a servo control 24, which drives a voice coil motor ("VCM") 28 that rotates an axle 40 through an arc and that is connected to and thereby rotates E-block 38 to pivot or move about that same arc and thereby to move its associated supporting arms $34_x$ relative to the surface of disks $36_x$. In general, servo control 24 may be constructed as known in the art, but in the preferred embodiments additional modifications are made to it, as detailed later, so as to improve its CMRR performance without a significant increase its size, so that in all events a driving signal is provided to VCM 28 to quickly change the position of axle 40 and thereby of E-block 38, again to thereby move the associated supporting arms $34_x$ for efficient writing of data to, and reading of data from, the surface of disks $36_x$. Servo controller 24 also controls a spindle motor 30 that fully rotates an axle 42 that is connected to and thereby fully rotates disks $36_1$ and $36_2$. Lastly, note that various additional items may be associated with the apparatus and circuitry shown in FIG. 1, and such items are known to one skilled in the art but are eliminated from the illustration and discussion so as to focus the present discussion.

Looking in general to the operation of computer system 10 with respect to reading and writing data from and to hard disk assembly 22, disks $36_1$ and $36_2$ have ferromagnetic surfaces (on either one or both sides) that spin about their axis under the control of spindle motor 30. Further, read/write head supporting arms $34_x$ are movable by E-block 38 when E-block 38 is moved or pivoted by VCM 28 and axle 40, where the latter are controlled to so pivot in response to servo control 24. More specifically, signals from controller 16 as well as feedback from VCM 28 to servo control 24 cause additional signals to control spindle motor 30 and VCM 28 so that E-block 38 moves (e.g., partially rotates) and thereby positions the read/write head sensor assemblies $35_x$ at the desired locations near the surface of each disk $36_x$ to write or read the desired data. During the same time period, preamplifier 20 appropriately energizes the read/write head sensor assemblies $35_x$ to either read data from, or write data to, an appropriate one or more of the disks $36_x$. Accordingly, data in this manner is communicated between preamplifier 20 and data channel 18, such as from bus B to a desired disk $36_1$ or $36_2$ or from such a desired disk $36_1$ or $36_2$ back to bus B. Thus, such data is further accessible by other items connected directly to, or coupled via other circuitry, to bus B.

Figure 2:
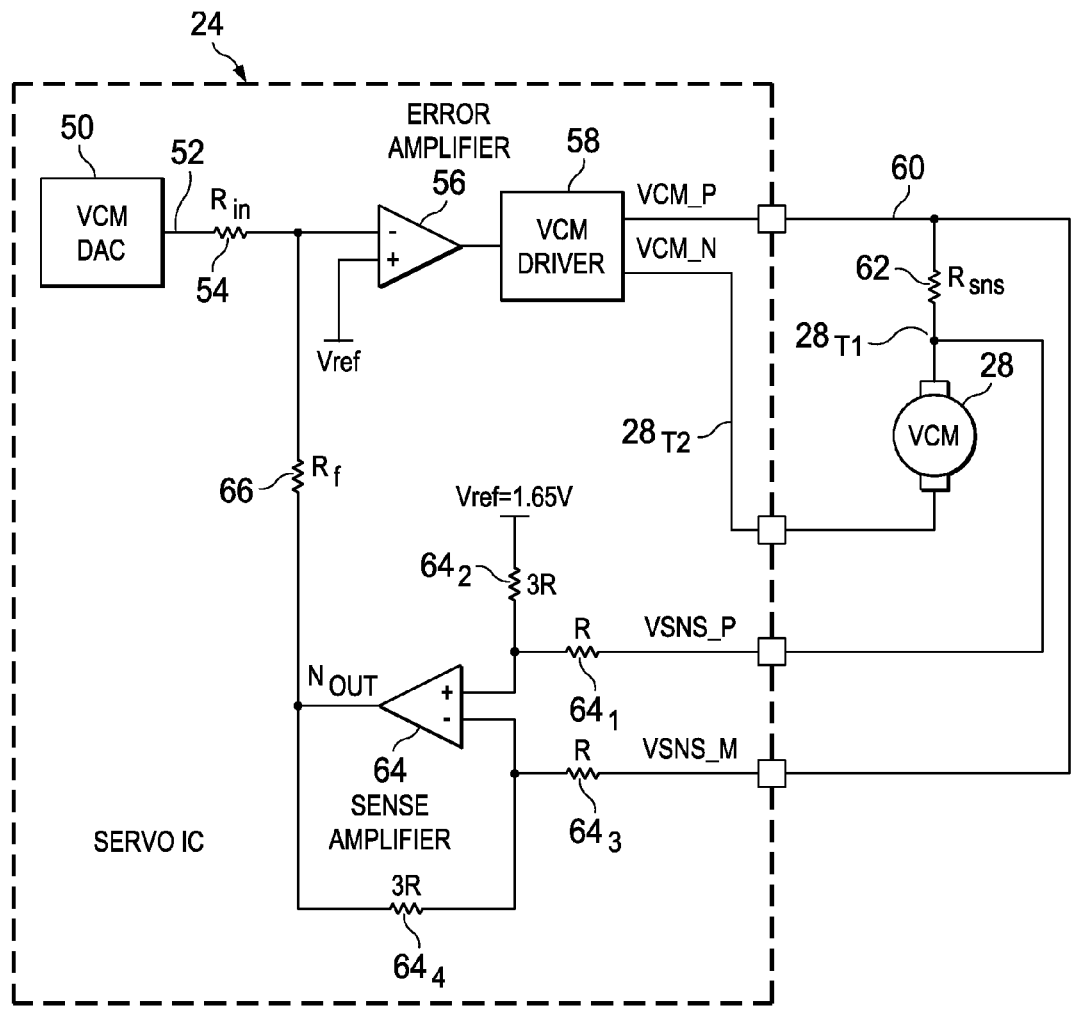
FIG. 2 illustrates an electrical functional diagram of various aspects of servo control 24 from FIG. 1.

FIG. 2 illustrates an electrical functional diagram of various aspects of servo control 24 from FIG. 1, which in the block form of FIG. 2 may represent either the prior art or the preferred embodiments, where the latter is further explored later in connection with adjusting resistance in connection with the gain stage. Looking first however to the more general depiction of FIG. 2, a VCM digital-to-analog converter ("DAC") 50 is included that receives a digital signal, such as from data channel 18 (see FIG. 1) so as to cause a control voltage to be provided to VCM 28. The output of VCM DAC 50 is connected to a node 52 that is connected through a resistor 54 to the inverting input of an amplifier 56, labeled as an error amplifier 56 for reasons evident below. The non-inverting input of amplifier 56 is connected to a reference voltage, $V_{ref}$. The output of amplifier 56 is connected an as input to a VCM driver 58, which provides respective positive and negative voltages VCM_P and VCM_N for driving VCM 28; more particularly, voltage VCM_P is connected to a node 60 that is coupled through a sensing resistor 62 to one terminal $28_{T1}$ of VCM 28, and voltage VCM_N is connected to another terminal $28_{T2}$ of VCM 28. Terminal $28_{T1}$ provides a sensed voltage VSNS_P through a resistor $64_1$ to the non-inverting input of a sense amplifier 64, and node 60 provides a sensed voltage VSNS_M through a resistor $64_3$ to the inverting input of sense amplifier 64, where for sake of convention the use of P and N in the sensed voltages VSNS_P and VSNS_M, respectively, is to indicate that one is coupled to the plus (or non-inverting) and the other is coupled to the minus (or inverting) inputs of sense amplifier 64. Sense amplifier 64 may be one of various amplifying devices or configurations, where numerous operational amplifiers serve as typical examples. The reference voltage, $V_{ref}$, is connected through a resistor $64_2$ to the non-inverting input of sense amplifier 64, and the output of sense amplifier 64 is connected to a stage output node $N_{OUT}$ that is connected in a gain stage feedback manner through a resistor $64_4$ to the inverting input of sense amplifier 64. In a typical configuration and so as to set its gain (e.g., for a gain of three), then resistor $64_2$ is a multiple (i.e., a factor of three) in resistance as compared to resistor $64_1$, and resistor $64_4$ is that same multiple (i.e., the factor of three) in resistance as compared to resistor $64_3$. Lastly, stage output node $N_{OUT}$ is connected in a forward feedback path of the servo control loop through a VCM error feedback resistor 66 to the inverting input of amplifier 56.

The general operation of the blocks of servo control 24 in FIG. 2 is now described. From FIG. 1, data channel 18, in response to information from controller 16 that indicates a desired location for either a read or write of data with respect to a disk $36_x$, provides a digital signal to servo control 24 that corresponds to the desired movement of one or more read/write head sensor assemblies $35_x$ relative to the disk(s) $36_x$. In FIG. 2, this digital signal is converted by VCM DAC 50 to an analog voltage that is coupled to resistor 54 and provides a current to the non-inverting input to amplifier 56. Amplifier 56 is shown in FIG. 2 as an error amplifier 56 in that it is influenced by a feedback signal, via VCM error feedback resistor 66, so as to correctly converge to a desired corresponding control current for VCM 28. Thus, the output of error amplifier 56 is coupled to a VCM driver 58 that provides a set of differential voltage signals VCM_P and VCM_N corresponding to the adjustments as provided by the output of error amplifier 56. The differential voltage signals VCM_P and VCM_N, which in a typical contemporary device may have a difference between them of 12V±10%, are connected as described above, thereby providing a bias to VCM 28 and resistor 62. As appreciated by one skilled in the art, resistor 62 is referred to as a sensing resistor as it is placed in-series with VCM 28 relative to the differential voltage signals VCM_P and VCM_N, so that the current through sensing resistor 62 is representative of the current flowing through VCM 28, thereby representing a measure of the movement of VCM 28 (and its corresponding axle 40 in FIG. 1). Further, the current through sensing resistor 62 creates a corresponding voltage across that resistor, and that voltage is sensed by way of the differential voltage signals VSNS_P and VSNS_M, coupled via respective resistors $64_1$ and $64_3$ to the inputs of amplifier 64. Amplifier 64 is referred to in FIG. 2 as a sensing amplifier, as it also corresponds to the feedback loop that senses the operation of VCM 28. Moreover, amplifier 64 is connected in a well-known configuration so that the resistors $64_1$, $64_2$, $64_3$, and $64_4$, associated with its inputs and feedback, affect the gain of the amplifier configuration and, as detailed below, also affect its CMRR. Accordingly, the voltage output of sense amplifier 64 also represents the operation of VCM 28, and that voltage is coupled to VCM error feedback resistor 66 and in turn influences the input to error amplifier 56 in a known manner.

With an understanding of the preceding, attention is now turned to the CMRR of sense amplifier 64 in FIG. 2. Note that the inductive fly-back of VCM 28 is coupled to the non-inverting and inverting inputs of sense amplifier 64, and this voltage may be in the range of 1V below ground to 1V higher than the voltage supply; thus, in combination with the typical power supply mentioned above of 12V±10%, then the total swing input to sense amplifier 64 may be in the range of −1V to 14.2V. Further, even as the error voltage from amplifier 56 output approaches zero as the desired target speed/position of VCM 28 is achieved, there is still the common mode voltage coupled into sense amplifier, for example, because that the voltage supply, so as the common mode level of VSNS_P and VSNS_M, varies during the operation. Thus, the wide range input of the common mode variation may couple into servo control 24 and affect the accuracy of its control signals, thereby also affecting the positional/speed accuracy of VCM 28. Accordingly, the preferred embodiments endeavor to improve the CMRR of the gain stage of servo control 24, as further appreciated in the remainder of this document.

Figure 3:
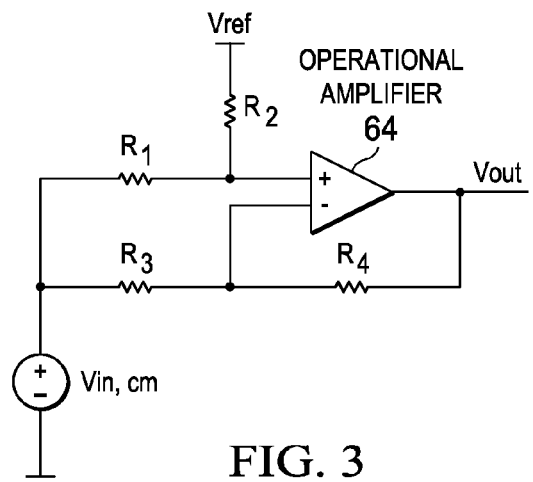
FIG. 3 illustrates amplifier 64 of FIG. 2 connected in a common-mode configuration.

To further appreciate various aspects of the preferred embodiments, a discussion of the CMRR of the gain stage provided by sense amplifier 64 in FIG. 2 is facilitated with reference to the electrical drawing in FIG. 3. Specifically, FIG. 3 illustrates amplifier 64 of FIG. 2 but is shown connected in a common-mode configuration, that is, where its differential inputs share a common input voltage, labeled in FIG. 3 as $v_{in,cm}$. As known in the art, such a configuration is often used to analyze a circuit with respect to its common mode behavior, that is, its response to the voltage that is the same, or in common, with both of its differential inputs. Further, the four resistors $64_1$, $64_2$, $64_3$, and $64_4$, associated with the inputs and feedback of amplifier 64 from FIG. 2, are re-numbered in FIG. 3 as resistors $R_1$, $R_2$, $R_3$, and $R_4$, respectively, to simplify the conventions used in the remainder of this document.

Given the configuration of FIG. 3, one skilled in the art may confirm that assuming that amplifier 64 is ideal at low frequency, the output of amplifier 64 may be written as shown in the following Equation 1:

$$v_{out} = \frac{R_1(R_3 + R_4)}{(R_1 + R_2)R_3} V_{ref} + \frac{R_2 R_3 - R_1 R_4}{(R_1 + R_2)R_3} v_{in,cm} \qquad \text{Equation 1}$$

In Equation 1, note that the first term (i.e., $$\frac{R_1(R_3 + R_4)}{(R_1 + R_2)R_3} V_{ref}\Big),$$

regardless of the values of the resistors, is responsive to the reference voltage $V_{ref}$. Therefore, assuming $V_{ref}$ is constant, then the contribution of this term to $v_{out}$ is a fixed or constant DC value, and that value may be offset by making a calibration adjustment to the output of VCM DAC 50. However, the second term in Equation 1 (i.e., $$\frac{R_2 R_3 - R_1 R_4}{(R_1 + R_2)R_3} v_{in,cm}\Big)$$

depends on the varying input voltage $v_{in,cm}$, that is, it is the common mode responsiveness of amplifier 64, and note further that even if the amplifier is ideal, this contribution to $v_{out}$ is also influenced by the four resistors of the configuration. In other words, even were amplifier 64 ideal, a mismatch in the resistance of these resistors still introduces a common mode factor into the sense amplifier and therefore undesirably influences output $v_{out}$.

Given the above observations and with the ability to ignore the constant DC aspect of Equation 1 (i.e., from its first term), then the change in the output, as a function of the common mode voltage input, defines the Common Mode Gain $A_c$ and may be written as in the following Equation 2:

$$A_c = \frac{dv_{out}}{dv_{in,cm}} = \frac{R_2 R_3 - R_1 R_4}{(R_1 + R_2)R_3} \qquad \text{Equation 2}$$

Next, dividing the numerator and denominator of Equation 2 by $R_1 R_2$ yields the following Equation 3:

$$A_c = \frac{dv_{out}}{dv_{in,cm}} = \frac{\frac{R_3}{R_1} - \frac{R_4}{R_2}}{\frac{R_3}{R_2} + \frac{R_3}{R_1}} \qquad \text{Equation 3}$$

From Equation 3, it is observed in connection with the present inventive preferred embodiments that CMRR may be reduced by matching the ratio of resistors $R_3$ and $R_1$ (i.e., $R_3/R_1$ with the ratio of resistors $R_4$ and $R_2$ (i.e., $R_4/R_2$). In other words, as these two ratios approach one another or are made to be equal, then the numerator of Equation 3 approaches or ideally reaches zero, thereby providing a desirably low CMRR for the circuit configuration. Stated alternatively, the normalized difference between $R_3$ and $R_1$, hereafter shown as $\Delta_{13}$, and the normalized difference between $R_4$ and $R_2$, hereafter shown as $\Delta_{24}$, may be as shown in the following respective Equations 4 and 5:

$$\Delta_{13} = \frac{R_3 - R_1}{R_1} = \frac{R_3}{R_1} - 1 \qquad \text{Equation 4}$$

$$\Delta_{24} = \frac{R_4 - R_2}{R_2} = \frac{R_4}{R_2} - 1 \qquad \text{Equation 5}$$

Given the above observations and conventions, Equation 3 may be re-written as in the following Equation 6:

$$A_c = \frac{dv_{out}}{dv_{in,cm}} = \frac{\Delta_{13} - \Delta_{24}}{\frac{R_3}{R_2} + \frac{R_3}{R_1}} \qquad \text{Equation 6}$$

Either Equation 6, or the ratio as discussed in connection with Equation 3, therefore, demonstrates the benefits of matching the identified resistor ratios in the configuration of FIG. 3, as is the endeavor of the preferred embodiments, as further detailed below.

Figure 4:
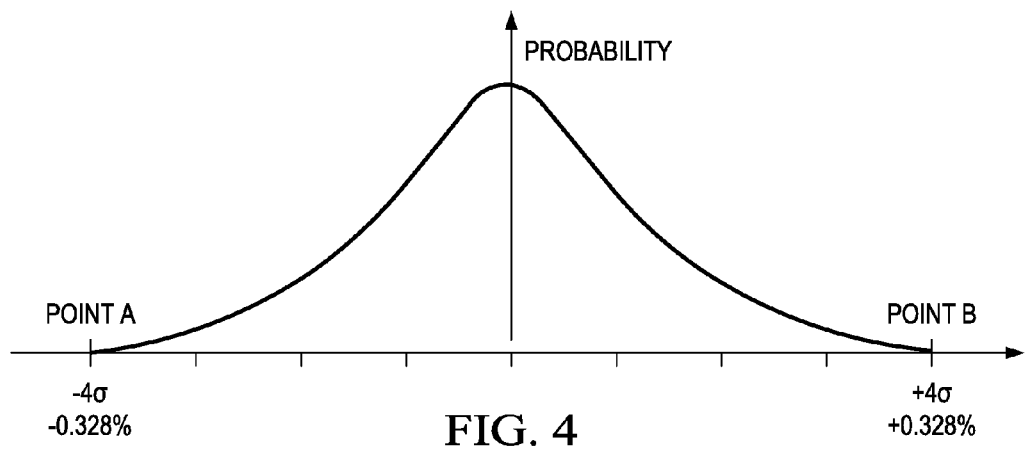
FIG. 4 illustrates the Guassian distribution of the standard deviation $\sigma_{A_{13}}$ associated with the resistors $R_1$ and $R_3$ in FIG. 3.
Figure 5:
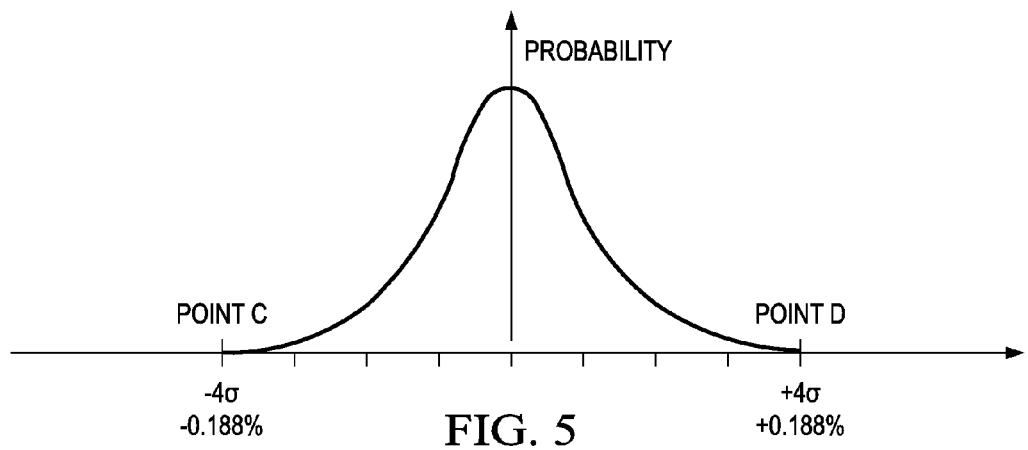
FIG. 5 illustrates the Guassian distribution of the standard deviation $\sigma_{A_{24}}$ associated with the resistors $R_2$ and $R_4$ in FIG. 3.

Before proceeding with additional discussion of the preferred embodiments, certain observations in connection with prior art devices may prove helpful. In silicon implementations of the resistors used in the configuration of FIG. 3 (and therefore likewise in FIG. 2), $\Delta_{13}$ and $\Delta_{24}$ are usually modeled as Guassian random variables with zero mean and standard deviations $\Delta_{13}$ and $\Delta_{24}$, respectively. Thus, assume for a given example that $R_1 = R_3 = 30$ k$\Omega$, $R_2 = R_4 = 90$ k$\Omega$, and with all resistors having a width of 4 μm, then the Guassian distribution with the standard deviations $\Delta_{13}$ and $\Delta_{24}$ are as shown in FIGS. 4 and 5, respectively. As shown in those Figures, the instance of four standard deviations (i.e., $4\sigma$) of $\Delta_{13}$ and $\Delta_{24}$ are respectively 0.328% and 0.188%. For those examples, therefore, then the worst case Common Mode Gain Ac (i.e., assuming $\Delta_{13}$ and $\Delta_{24}$ are independent Guassian random variables) can be calculated as in the following Equation 7:

$$A_c = \frac{\sqrt{(4\sigma_{\Delta 13})^2 + (4\sigma_{\Delta 24})^2}}{\frac{R_3}{R_2} + \frac{R_3}{R_1}} \qquad \text{Equation 7}$$

$$= \frac{\sqrt{(0.00328)^2 + (0.00188)^2}}{\frac{4}{3}}$$

$$= 0.002835$$

$$\approx 0.003$$

Recall that in the present example the differential gain ($A_d$) of the sense amplifier is three (by the ratio of $R_2$ to $R_1$ and $R_4$ to $R_3$), so with a common mode gain of 0.003 as shown in Equation 7, then CMRR=$|A_d/A_c|$=|3/0.003|=1000, corresponding to a CMRR of 60 dB. For certain applications, this value has been sufficient.

As introduced in the Background of the Invention section of this document, as technology and demands increase, there is a need to further improve CMRR. The example of 60 dB from the Background has now been described above, but recall also that the Background describes that the prior art approach to further improving that value, for example to a value of 80 dB, requires a 100 times increase in area because resistor matching level is proportional to $1/\sqrt{WL}$. Thus, as detailed below, the preferred embodiments implement alternatives to improving CMRR without the significant area penalty just described, and the other drawbacks that such a prior art approach provides (e.g., cost, manufacturability, and the like).

Figure 6:
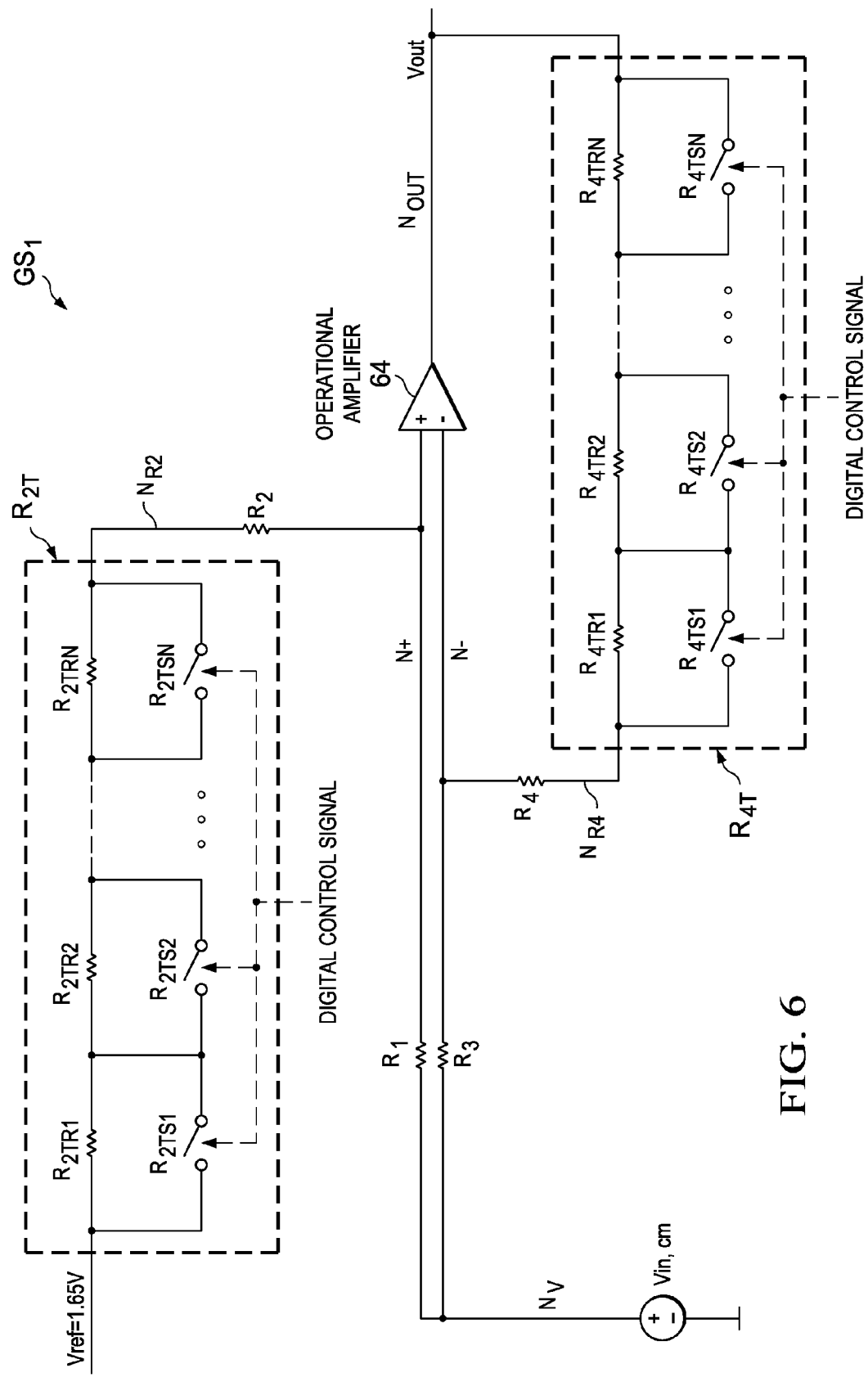
FIG. 6 illustrates a schematic of a gain stage $GS_1$, such as for use in servo control 24 of FIG. 2.

FIG. 6 illustrates a schematic of a gain stage $GS_1$, such as for use in servo control 24 of FIG. 2 and shown connected in a common mode configuration for sake of comparison to the configuration shown in FIG. 3. Further, certain identifiers and conventions from earlier figures are carried forward into FIG. 6 so as to facilitate an understanding to one skilled in the art. Thus, in general and looking first to the similarities between FIGS. 6 and 3, gain stage $GS_1$ includes a differential input amplifier 64, having its non-inverting input connected to a node N+ that is further connected to a resistor $R_1$ and a resistor $R_2$ and its inverting input connected to a node N− that is further connected to a resistor $R_3$ and a resistor $R_4$. A node $N_v$ of resistors $R_1$ and $R_3$, opposite respective nodes N+ and N−, is connected to a common input voltage, labeled in FIG. 6 as $v_{in,cm}$.

Figure 7:
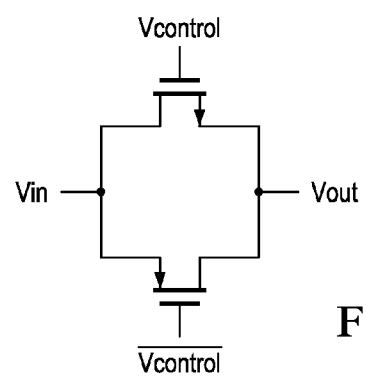
FIG. 7 illustrates a schematic of a transmission gate for use as a switch in various trim circuit embodiments.

Continuing with gain stage $GS_1$, and in contrast to the prior art, it includes two resistor trim circuits, identified in FIG. 6 (and later Figures) as resistor trim circuits $R_{2T}$ and $R_{4T}$. More specifically, resistor trim circuit $R_{2T}$ is connected between a node $N_{R2}$ and the reference voltage, $V_{ref}$, and resistor trim circuit $R_{4T}$ is connected between a node $N_{R4}$ and the output node, $N_{OUT}$, of amplifier 64. In this illustrated preferred embodiment, each of resistor trim circuits $R_{2T}$ and $R_{4T}$ is constructed in a similar fashion. Thus, looking to resistor trim circuit $R_{2T}$ by way of example, it includes an integer number N of resistors, $R_{2TR1}$, $R_{2TR2}$, ..., $R_{2TRN}$, connected in series between node $N_{R2}$ and the reference voltage, $V_{ref}$. In a preferred embodiment, each of these resistors has a same resistance value, and each is preferably constructed of polysilicon. Further, each of these N resistors has a respective switch, $R_{2TS1}$, $R_{2TS2}$, ..., $R_{2TSN}$, connected in parallel with the resistor, so that if a switch is closed it shunts (or short-circuits) the resistance with which it is connected in parallel. For example, therefore, if switch $R_{2TS1}$ is closed, then it shunts the resistance of resistor $R_{2TR1}$; thus, if at that same time all of the other switches in trim circuit $R_{2T}$ are open, then the series resistance between the reference voltage, $V_{ref}$, and node $N_{R2}$ includes the resistance of all resistors $R_{2TR2}$, ..., $R_{2TRN}$, but it does not include the resistance of resistor $R_{2TR1}$. In a preferred embodiment, each switch of switches $R_{2TS1}$, $R_{2TS2}$, ..., $R_{2TSN}$ is constructed by a respective CMOS transmission gate, that is, with a PMOS transistor having its channel connected in parallel with an NMOS transistor, as shown schematically in FIG. 7, and as well known in the art. The transmission gate is preferable so as to reduce the effect of inconsistency in the on-state resistance of either an nMOS or pMOS device, whereas the transmission gate device sizes in the preferred embodiment are selected so that the resistance of the gate when its paired transistors are on is relatively constant during operation. In any event, therefore, an N-bit digital control signal is provided to control the N switches in trim circuit $R_{2T}$, where more particularly each bit in the N-bit digital control signal is provided to a respective one of the N switches (and, in complementary fashion to control the complementary MOS transistors of the transmission gate). Given the above as well as the illustrations of FIG. 6, one skilled in the art will appreciate the comparable connections and conventions in for trim circuit $R_{4T}$ and, thus, a detailed discussion is avoided here so as to avoid unduly lengthening the description.

The general operation of gain stage $GS_1$ will be appreciated by one skilled in the art given the earlier discussion, and additional discussion is now directed to the functionality as provided by the inclusion of resistor trim circuits $R_{2T}$ and $R_{4T}$. In operation, an N-bit control signal is provided to resistor trim circuit $R_{2T}$ and a separate N-bit control signal is provided to resistor trim circuit $R_{4T}$. The manner of establishing the actual binary values for each bit in each N-bit control signal may be selected by one skilled in the art, and one preferred embodiment approach is described later. In any event, by turning on or off the switches in a respective resistor trim circuit, the series resistance of those resistors that are not shunted by a respective switch combine and then are added to the resistance of the corresponding resistor connected to the switch circuit. Thus, the non-shunted resistors in resistor trim circuit $R_{2T}$ combine with the resistance of resistor $R_2$ to provide a resistance between $V_{ref}$ and node N+, and the non-shunted resistors in resistor trim circuit $R_{4T}$ combine with the resistance of resistor $R_4$ to provide a resistance between node $N_{OUT}$ and node N−. This statement, of course, assumes that the shunted resistors are completely without resistance, but as discussed later there is some resistance associated with the enabled MOS transmission gate that also affects the combined resistance provided by the trim circuit. In any event, given the ability to trim or vary the resistance of a trim circuit, in the preferred embodiment and as introduced earlier, gain stage $GS_1$ is adjusted, or tuned, so as to bring the ratio of $\Delta_{24}$ to match that of $\Delta_{13}$, as explained above in connection with Equations 2 through 6. Accordingly, gain stage $GS_1$ operates to provide the desired gain while also improving CMRR to a level that is improved over the prior art. Moreover, while some additional area is needed to accommodate the devices of the trim circuits, considerably less area (e.g., about 25% of) is required to move the CMRR from 60 dB to 80 dB compared to that which would be required by increasing the size (e.g., 100 times) of the polysilicon resistors.

It is further recognized in connection with the preferred embodiments that, as shown in gain stage $GS_1$ of FIG. 6, because of the very wide common mode range of $v_{in,cm}$ (−1V to 14.2V as addressed earlier) and similar wide signal range (−0.425V to 10.425V) at nodes N− and N+, any low voltage switch connected to these nodes ($v_{in,cm}$, N+, N−) is not preferable because of device safety reasons and the negative voltage potential may turn on the parasitic diode of the nMOS device in the transmission gate switch. Therefore, the preferred embodiment approach for CMRR trim is placing trim circuit $R_{2T}$ between $V_{ref}$ and $R_2$, and placing trim circuit $R_{4T}$ between $V_{out}$ and $R_4$. As the result, the resistances $R_4$ and $R_2$ are trimmed, rather than $R_1$ and $R_3$ are trimmed, by connected trim unit $R_{2T}$ and $R_{4T}$ respectively in series with $R_2$ and $R_4$. According to Equations 3 and 6, improving CMRR from 60 dB to 80 dB requires the difference between ratios $R_4/R_2$ and $R_3/R_1$ to be decreased at least by 10 times, more specifically, moving ratio $R_4/R_2$ at least 10 times closer to ratio $R_3/R_1$. Considering the random nature of the ratios $R_4/R_2$ and $R_3/R_1$, at least 10 grid steps are preferably evenly placed between the largest possible difference of these two ratios. The largest possible mismatching difference is given by the original matching level of $R_4/R_2$ and $R_3/R_1$, i.e. without helping from the trim units $R_{2T}$ and $R_{4T}$, and it is calculated in the numerator of Equation 7, $$\sqrt{(4\sigma_{\Delta 13})^2 + (4\sigma_{\Delta 24})^2} = \sqrt{(0.00328)^2 + (0.00188)^2}$$
$$= 0.00378.$$

The 80 dB CMRR target is guaranteed by available minimum steps of $(R_4+R_{4T})/(R_2+R_{2T})$ when operating the switches in the trim circuits. Substituting the minimum trim step, which is $1/10$ of the largest possible mismatching difference (between $R_4/R_2$ and $R_3/R_1$), into the numerator of Equation 7 results in 80 dB CMRR. Considering leaving some margin for the trim accuracy and taking the advantage of binary code, in a preferred embodiment 16 grid steps or 16 levels (i.e., using a 4 bit binary code) is chosen. The most significant bit, MSB b<3> (i.e. the sign bit), is used to determine whether $(R_4+R_{4T})/(R_2+R_{2T})$ is larger than $R_3/R_1$ or $(R_4+R_{4T})/(R_2+R_{2T})$ is less than $R_3/R_1$, that is, to determine whether the second term in Equation 1 is positive or negative. If $(R_4+R_{4T})/(R_2+R_{2T})$ is larger than $R_3/R_1$, then preferably some switches in trim unit $R_{4T}$ are turned on (leave all switches in $R_{2T}$ open) to reduce $(R_4+R_{4T})$ and make $(R_4+R_{4T})/(R_2+R_{2T})$ approach $R_3/R_1$. If $(R_4+R_{4T})/(R_2+R_{2T})$ is less than $R_3/R_1$, then preferably some switches in trim unit $R_{2T}$ are turned on (leave all switches in $R_{4T}$ open) to reduce $(R_2+R_{2T})$ and make $(R_4+R_{4T})/(R_2+R_{2T})$ close to $R_3/R_1$. The three least significant bits, LSBs b<2:0>, are used to control how many switches need to be closed either in $R_{2T}$ or $R_{4T}$. So in the case of improving CMRR from 60 dB to 80 dB, N=8 for both $R_{2T}$ and $R_{4T}$. For different CMRR improvement requirement, the trim bit (i.e. trim step numbers) needs to be recalculated.

Figure 8:
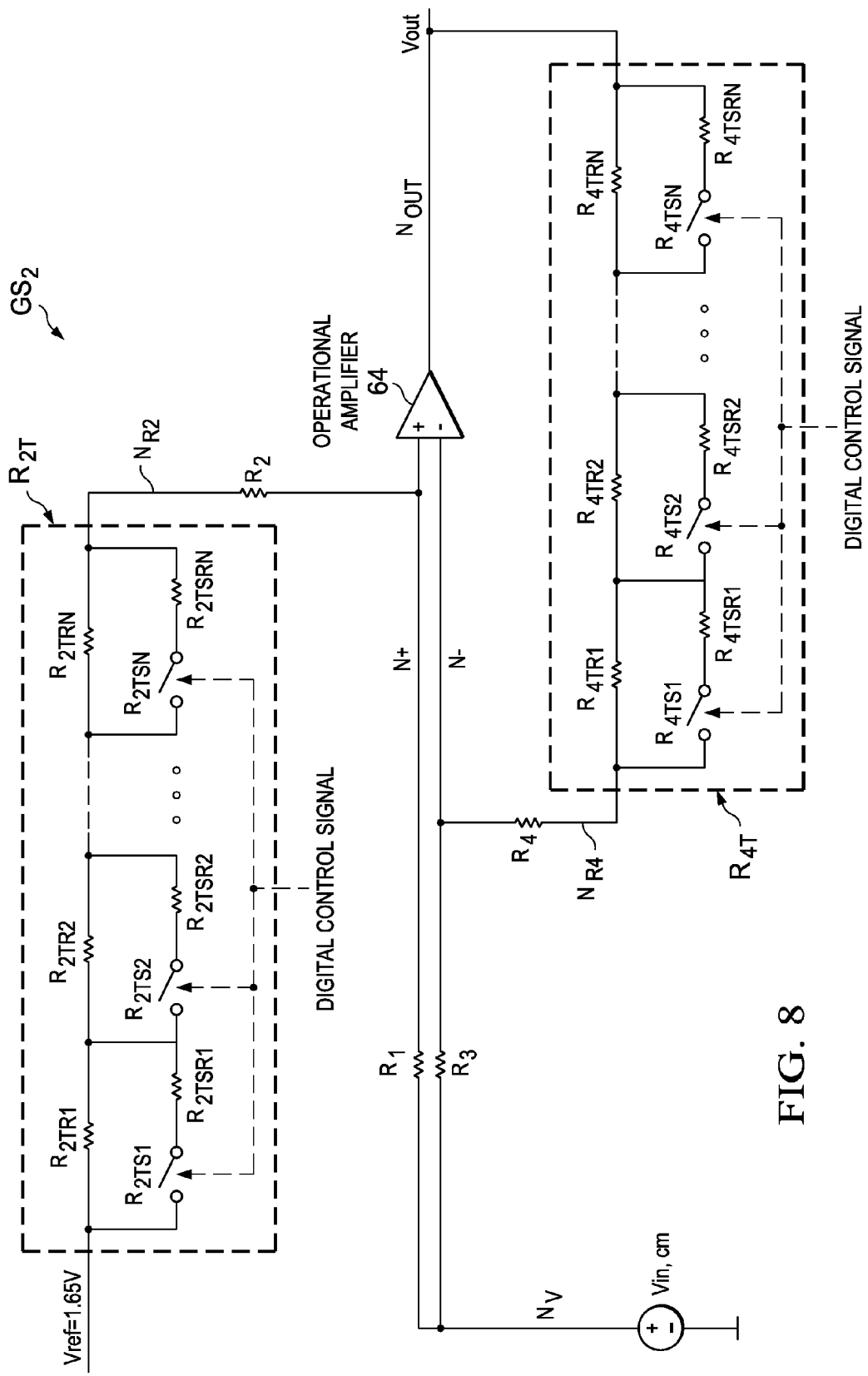
FIG. 8 illustrates a schematic of an alternative gain stage $GS_2$ that may be used in servo control 24 of FIG. 2.

FIG. 8 illustrates a schematic of an alternative gain stage $GS_2$, which like gain stage $GS_1$ may be used in servo control 24 of FIG. 2 and is also shown connected in a common mode configuration for sake of comparison to the configuration shown in FIG. 3. The similarities of FIGS. 8, 6, and 3 will be readily appreciated by one skilled in the art and therefore are not detailed here, as the reader is assumed to be familiar with the earlier discussion. Thus, the discussion below focuses on the differences presented in gain stage $GS_2$ as well as some corresponding observations.

The difference between gain stage $GS_2$ and gain stage $GS_1$ is that the trim circuits $R_{2T}$ and $R_{4T}$ in gain stage $GS_2$ have a combined series switch and separate resistor connected respectively in parallel with each series resistance in the trim circuit. More specifically and by way of example looking to trim circuit $R_{2T}$, it again includes an integer number N of resistors, $R_{2TR1}, R_{2TR2}, \ldots, R_{2TRN}$, connected in series between node $N_{R2}$ and the reference voltage, $V_{ref}$; however, each one of those N resistors is connected in parallel to a combination of a switch, again preferably formed by a CMOS transmission gate, connected in series with an additional resistor. By way of example considering resistor $R_{2TR1}$ of trim circuit $R_{2T}$, connected in parallel thereto is a series combination of a switch $R_{2TS1}$ and also a resistor $R_{2TSR1}$. As another example, for resistor $R_{2TR2}$ of trim circuit $R_{2T}$, connected in parallel thereto is a series combination of a switch $R_{2TS2}$ and also a resistor $R_{2TSR2}$. As a final example, for resistor $R_{2TRN}$ of trim circuit $R_{2T}$, connected in parallel thereto is a series combination of a switch $R_{2TSN}$ and also a resistor $R_{2TSRN}$. In a preferred embodiment, the resistance of each resistor $R_{2TSRx}$ connected in series to a corresponding switch $R_{2TSx}$ is of the same material as the series resistors $R_{2TR1}, R_{2TR2}, \ldots, R_{2TRN}$, and, thus, for the example described above all such resistors are polysilicon. Given the preceding examples with respect to trim circuit $R_{2T}$, one skilled in the art will appreciate that trim circuit $R_{4T}$ likewise includes similar connections. Thus, for example, considering resistor $R_{4TR1}$ of trim circuit $R_{4T}$, connected in parallel thereto is a series combination of a switch $R_{4TS1}$ and also a resistor $R_{4TSR1}$. Similarly, resistor $R_{4TR2}$ has a parallel connection to a series combination of a switch $R_{4TS2}$ and also a resistor $R_{4TSR2}$, and resistor $R_{4TRN}$ has a parallel connection to a series combination of a switch $R_{4TSN}$ and also a resistor $R_{4TSRN}$.

Also in the preferred embodiment, preferably the on-resistance of each switch $R_{2TSx}$ (or $R_{4TSx}$) is considerably less than the resistance of the respective resistor $R_{2TSRx}$ (or $R_{4TSRx}$) to which it is connected in series, so that trimmed CMRR deviation due to the temperature variation introduced by the on-state resistance of the switches is minimized. For example, the on-resistance of a switch $R_{2TSx}$ (or $R_{4TSx}$) may be in the range of 100Ω to 200Ω, while the resistance of the respective resistor $R_{2TSRx}$ (or $R_{4TSRx}$) may be in the range of 1KΩ to 10KΩ.

The general operation of gain stage $GS_2$ should be appreciated by one skilled in the art given the earlier discussions, with the difference between it and gain stage $GS_1$, discussed in connection with FIG. 6, is that gain stage $GS_2$ has a non-negligible parallel resistance for each resistor $R_{2TRx}$ and its corresponding switched-in parallel resistance $R_{2TSRx}$ when the corresponding switch $R_{2TSx}$ is closed or enabled (or likewise a non-negligible parallel resistance for each resistor $R_{4TRx}$ and its corresponding switched-in parallel resistance $R_{4TSRx}$ when the corresponding switch $R_{4TSx}$ is closed or enabled), where again the switches are controlled by corresponding digital control signals coupled to each trim circuit $R_{2T}$ and $R_{4T}$. For example, in trim circuit $R_{2T}$ in FIG. 8, when switch $R_{2TS1}$ is closed, then the series resistance of that switch in its on state adds with the resistance of resistor $R_{2TSR1}$, and that combined resistance is thereby placed in parallel with resistor $R_{2TR1}$. In this manner and with a comparable operation for other switches in trim circuit $R_{2T}$, the combined series resistance of trim circuit $R_{2T}$ and resistor $R_2$ may be adjusted, and similarly the combined series resistance of trim circuit $R_{4T}$ and resistor $R_4$ may be adjusted, in an effort to bring the ratio of those two combined resistances to a same level as the ratio as between resistors $R_3$ and $R_1$, again therefore with the goal of improving the CMRR of gain stage $GS_2$.

Figure 9:
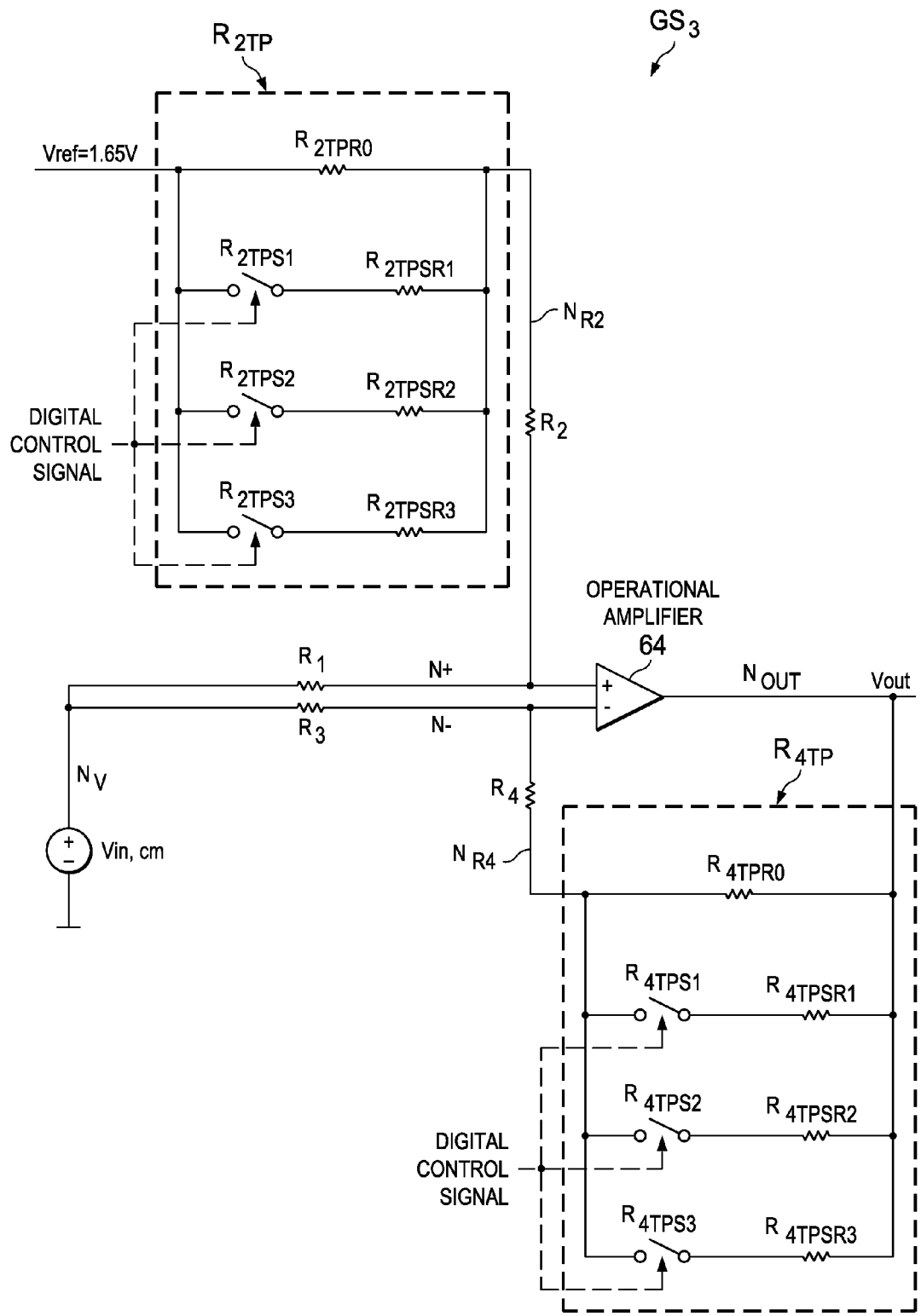
FIG. 9 illustrates a schematic of an alternative gain stage $GS_3$ that may be used in servo control 24 of FIG. 2.

FIG. 9 illustrates a schematic of an alternative gain stage $GS_3$, which like gain stages $GS_1$ and $GS_2$ may be used in servo control 24 of FIG. 2 and is shown connected in a common mode configuration for sake of comparison to the configuration shown in FIG. 3. The similarities of the various gain stages will be readily appreciated by one skilled in the art and therefore are not detailed here, as the reader is familiar with the earlier discussion. Thus, the discussion below focuses on the differences presented in gain stage $GS_3$ as well as some corresponding observations.

One difference between gain stage $GS_3$ and gain stage $GS_1$ is that the trim circuits $R_{2T}$ and $R_{4T}$ in gain stage $GS_3$, here shown as $R_{2TP}$ and $R_{4TP}$ due to their parallel nature, have one resistor (i.e., $R_{2TPR0}$ in trim circuit $R_{2TP}$ and $R_{4TPR0}$ in trim circuit $R_{4TP}$) in parallel with a number (e.g., three) of combinations, where each such combination includes a switch $R_{2TPSx}$, again preferably formed by a CMOS transmission gate, connected in series with a corresponding separate resistor $R_{2TPRx}$. More specifically with respect to trim circuit $R_{2TP}$, it again includes, in parallel with resistor $R_{2TPR0}$: (i) a switch $R_{2TPS1}$ connected in series with a resistor $R_{2TPSR1}$; (ii) a switch $R_{2TPS2}$ connected in series with a resistor $R_{2TPSR2}$; and (iii) a switch $R_{2TPS3}$ connected in series with a resistor $R_{2TPSR3}$. Similarly, with respect to trim circuit $R_{4TP}$, it includes, in parallel with resistor $R_{4TPR0}$: (i) a switch $R_{4TPS1}$ connected in series with a resistor $R_{4TPSR1}$; (ii) a switch $R_{4TPS2}$ connected in series with a resistor $R_{4TPSR2}$; and (iii) a switch $R_{4TPS3}$ connected in series with a resistor $R_{4TPSR3}$.

Another difference between gain stage $GS_3$ and gain stage $GS_1$ is the use of different resistance values of the resistors within each respective trim circuit. Specifically, in the trim circuit $R_{2TP}$, a binary trim scheme is employed, that is, resistor values of $R_{2TPSRx}$ are binary scaled, for example, choose $R_{2TPSR1}=20K\Omega$, $R_{2TPSR2}=40K\Omega$, $R_{2TPSR3}=80\Omega$, and $R_{2TR0}=2.4K\Omega$. As a result, there is the ability to turn on or off any of the three switches in trim circuit $R_{2TP}$ to result in any one of eight combinations ($2^3=8$) of resistance value for that trim circuit. In a preferred embodiment, a similar choice is made for trim circuit $R_{4TP}$, that is, choose $R_{4TPSR1}=20K\Omega$, $R_{4TPSR2}=40K\Omega$, $R_{4TPSR3}=80K\Omega$, and choose $R_{4TR0}=2.4K\Omega$. Lastly, for gain stage $GS_3$, preferably the on-resistance of each switch $R_{2TPSx}$ (or $R_{4TPSx}$) is considerably less than the resistance of the respective resistor $R_{2TPSRx}$ (or $R_{4TPSRx}$) to which it is connected in series, so that trimmed CMRR deviation due to the temperature variation introduced by the on-state resistance of the switches are minimized. In a preferred embodiment, the resistance of each resistor $R_{2TPSRx}$ connected in series to a corresponding switch $R_{2TPSx}$ is of the same material as the non-switched resistor $R_{2TPR0}$ of the corresponding trim circuit $R_{2TP}$ and the resistance of each resistor $R_{4TPSRx}$ connected in series to a corresponding switch $R_{4TPSx}$ is of the same material as the non-switched resistor $R_{4TPR0}$ of the corresponding trim circuit $R_{4TP}$; thus, for the example described above all such resistors are polysilicon.

The general operation of gain stage $GS_3$ should be appreciated by one skilled in the art given the earlier discussions, with the difference between it and gain stage $GS_1$, discussed in connection with FIG. 6, is that gain stage $GS_3$ does not shunt a resistance by closing a corresponding switch but instead may adjust the overall resistance of a trim circuit by closing one or more of the switches therein. Further, if the resistance R of each resistor in the trim circuit is identical and if there are I resistors connected in parallel due to the open/closed status of the switches of the circuit, then the overall resistance of the circuit it given by R/I. Thus, by adjusting the number of resistors in a trim circuit, variability is again provided to adjust the overall resistance of the trim circuit, which then adds to the resistor (i.e., $R_2$ or $R_4$) that is connected between that trim circuit and the node (i.e., N+ or N−, respectively) that provides an input to amplifier 64. Once more, therefore, the combined series resistance of trim circuit $R_{2TP}$ and resistor $R_2$ may be adjusted, and similarly the combined series resistance of trim circuit $R_{4TP}$ and resistor $R_4$ may be adjusted, in an effort to bring the ratio of those two combined resistances to a same level as the ratio as between resistors $R_3$ and $R_1$, again therefore with the goal of improving the CMRR of gain stage $GS_3$.

Figure 10:
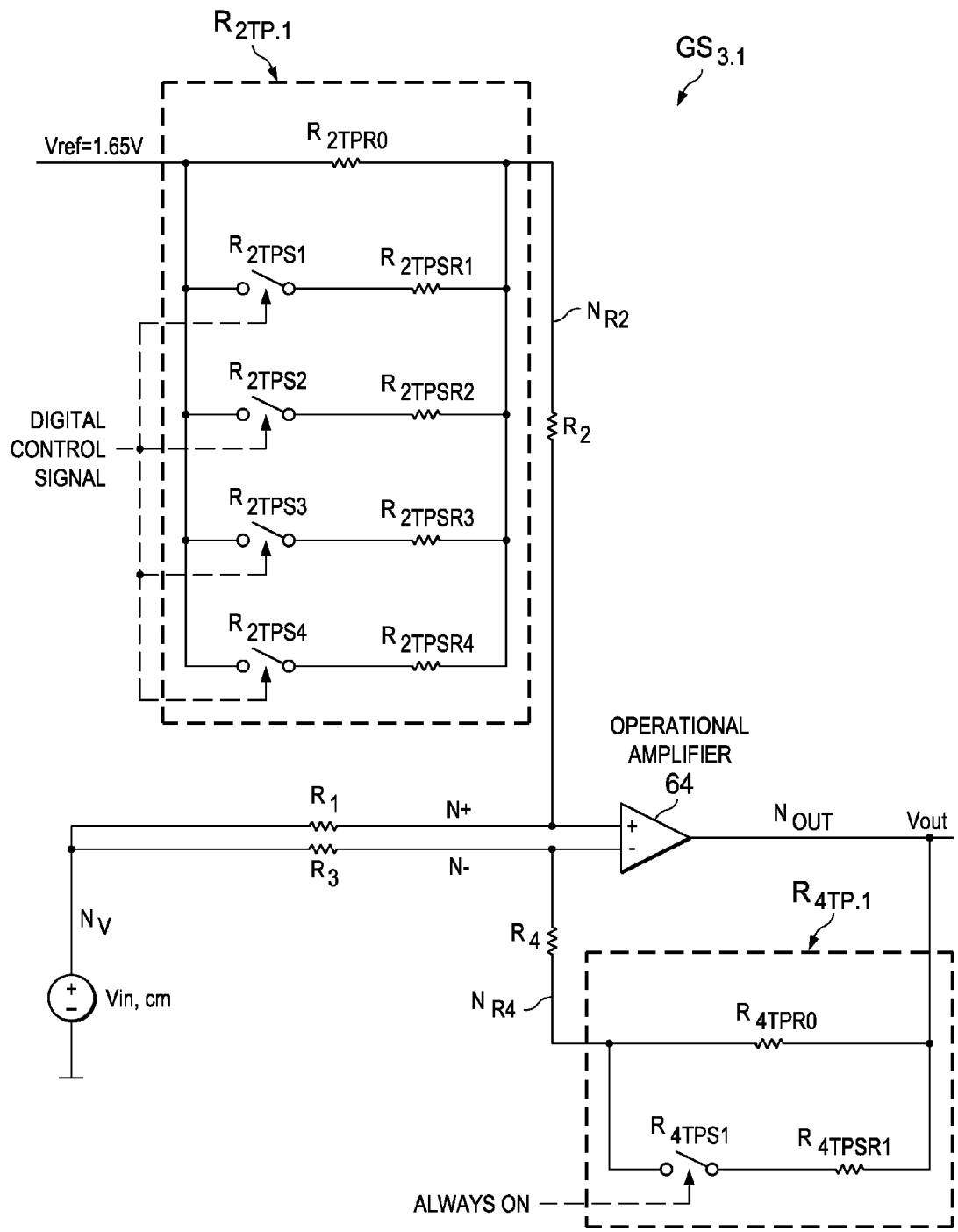
FIG. 10 illustrates a schematic of an alternative gain stage $GS_{3.1}$ that may be used in servo control 24 of FIG. 2.

FIG. 10 illustrates a schematic of an alternative gain stage $GS_{3.1}$, which is similar in various respects to gain stage $GS_3$ of FIG. 9 and, thus, only certain differences will be discussed here. By way of introduction, recall that gain stage $GS_3$ of FIG. 9 included three switched resistors in each of its trim circuits $R_{2TP}$ and $R_{4TP}$; in contrast, in gain stage $GS_{3.1}$ of FIG. 10, trim circuit $R_{2TP.1}$ includes four switched resistors and therefore shows an additional switch $R_{2TPS4}$ connected in series with a resistor $R_{2TPSR4}$, and trim circuit $R_{4TP.1}$ includes only a single switched resistor and therefore shows only switch $R_{4TPS1}$ connected in series with a resistor $R_{4TPSR1}$. Further, in the preferred embodiment for gain stage $GS_{3.1}$, preferably switch $R_{4TPS1}$ is connected or operated to always be on (i.e., closed) during operation, and therefore it in effect is a dummy switch in that its electrical attributes are always connected in series with resistor $R_{4TPSR1}$ for reasons described below. Further, recall in gain stage $GS_3$ of FIG. 9 that each of the three switched resistors in each trim circuit may be controlled to adjust trim direction given the binary difference between the resistor values connected to those respective resistors. In gain stage $GS_{3.1}$ of FIG. 10, again preferably the resistors in trim circuit $R_{2TP.1}$ are binary scaled (e.g., $R_{2TPSR1}=20K\Omega$, $R_{2TPSR2}=40K\Omega$, $R_{2TPSR3}=80K\Omega$, and $R_{2TPSR4}=160K\Omega$). Further, because the switch $R_{4TPS1}$ in trim circuit $R_{4TP.1}$ is always on during operation, it in effect biases the middle point of trim circuit $R_{2TP.1}$, that is, in trim circuit $R_{2TP.1}$ if switch $T_{2TPS1}$ (i.e., associated with resistor $T_{2TPSR1}$) is on and all other switches in trim circuit trim circuit $R_{2TP.1}$ are off, the circuit is balanced out, that is, the resistive combination of trim circuit $R_{2TP.1}$ is then approximately matched with that of trim circuit $R_{4TP.1}$. However, if also while switch $T_{2TPS1}$ (i.e., associated with resistor $T_{2TPSR1}$) in trim circuit $R_{2TP.1}$ is on, any one or more of the other switches in that trim circuit may be turned on which therefore will make the resistance of trim circuit $R_{2TP.1}$ less than trim circuit $R_{4TP.1}$ by eight different levels. Further, if in trim circuit $R_{2TP.1}$ switch $T_{2TPS1}$ (i.e., associated with resistor $T_{2TPSR1}$) is opened, then the resistance in trim circuit $R_{2TP.1}$ is larger than in trim circuit $R_{4TP.1}$ and indeed, any one or more of the other switches in trim circuit $R_{2TP.1}$ may be turned on which therefore will make the resistance of trim circuit $R_{2TP.1}$ larger than trim circuit $R_{4TP.1}$ by eight different levels.

Figure 11:
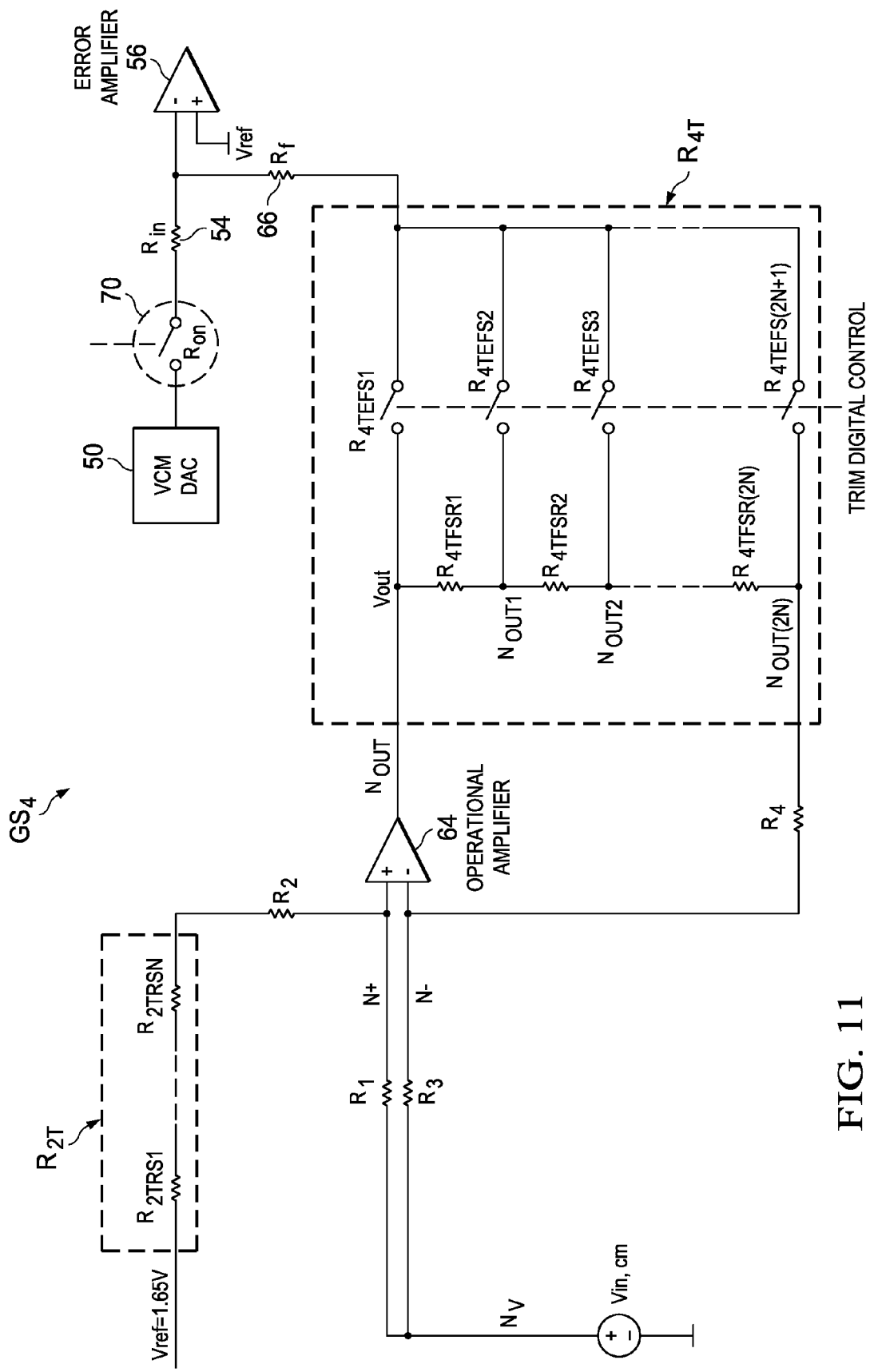
FIG. 11 illustrates a schematic of an alternative gain stage $GS_4$ that may be used in servo control 24 of FIG. 2.

FIG. 11 illustrates a schematic of an alternative gain stage $GS_4$, which like gain stages $GS_1$, $GS_2$, and $GS_3$ may be used in servo control 24 of FIG. 2 and is shown connected in a common mode configuration for sake of comparison to the configuration shown in FIG. 3; in addition, VCM DAC 50, resistor 54, VCM error feedback resistor 66, and error amplifier 56 are also shown in FIG. 11 as they relate to a switch 70 that is included for matching purposes, as further detailed below. The similarities of gain stage $GS_4$ with the above-described gain stages (e.g., respective trim circuits $R_{2T}$ and $R_{4T}$ connected between the appropriate nodes and the respective resistors $R_2$ and $R_4$) will be readily appreciated by one skilled in the art and therefore are not detailed here, as the reader is assumed to be familiar with the earlier discussion. However, both trim circuits $R_{2T}$ and $R_{4T}$ are changed in gain stage $GS_4$ as compared to the above-described stages. Thus, the discussion below focuses on the differences presented in gain stage $GS_4$ as well as some corresponding observations.

Looking to trim circuit $R_{2T}$, in the illustrated preferred embodiment it includes only a series connection of N resistors indicated as $R_{2TRS1}$ through $R_{2TRSN}$, each preferably having the same resistance. Thus, in the illustrated approach, there is not a digital signal or switch control to trim circuit $R_{2T}$, and it actually does not offer an adjustability of resistance, unlike the previous embodiments. In this approach, the fixed value of the combined resistance $R_2+R_{2T}$ is used to bias the middle point of the combined resistance of trim circuit $R_{4T}$ with resistor $R_4$, making the bidirectional trim possible as will be explained next. That is, if turning on switch $R_{4TEFS(N+1)}$ associated with node $N_{OUTN}$ and turning off the rest of the switches in trim circuit $R_{4T}$, the circuit is balanced out if no trim is needed. However, in the case where $(R_4+R_{4T})/(R_2+R_{2T})$ is not close enough to $R_3/R_1$, then preferably trim is implemented by changing the closed switch. Specifically, if $(R_4+R_{4T})/(R_2+R_{2T})$ is larger than $R_3/R_1$, then preferable only one switch is turned on between node $N_{OUT(N+1)}$ to $N_{OUT(2N)}$ to reduce the resistance provided by trim circuit $R_{4T}$ and this process is repeated which thereby searches until the appropriate switch in trim circuit $R_{4T}$ is on so as to make $(R_4+R_{4T})/(R_2+R_{2T})$ close enough to $R_3/R_1$ so as to make CMRR meet or closest to the desirable target. Conversely, if $(R_4+R_{4T})/(R_2+R_{2T})$ is less than $R_3/R_1$, then the preferred embodiment approach is to turn on one switch (only one switch) between node $V_{out}$ to $N_{OUT(N-1)}$ to increase the resistance of trim circuit $R_{4T}$ and again to try each such switch therein to effectively identify the right switch and turn it on to make $(R_4+R_{4T})/(R_2+R_{2T})$ close enough to $R_3/R_1$ so as to make CMRR meet or closest to the desirable target. In any event, therefore, again the combined series resistance of trim circuit $R_{2T}$ (i.e., N times the resistance of each resistor therein) combines in series with resistor $R_2$ to provide a resistance between the reference voltage, $V_{ref}$, and node N+.

Looking to trim circuit $R_{4T}$, in the illustrated preferred embodiment it includes a number of 2N resistors, that is, preferably it includes twice the number of resistors than in trim circuit $R_{2T}$; as demonstrated below, while each of the resistors in trim circuit $R_{4T}$ is physically connected in series between node $N_{OUT}$ and node $N_{R4}$, through the operation of a switch they optionally may be included either in the gain stage feedback path between the output of the stage and node $N_{R4}$ or the servo control forward feedback path to VCM error feedback resistor 66; thus, these resistors are designated as feedback selection resistors $R_{4TFSR1}$ through $R_{4TFSR(2N)}$. In addition, therefore, trim circuit $R_{4T}$ includes a number of 2N+1 switches, designated $R_{4TEFS1}$ through $R_{4TEFS(2N+1)}$. As discussed in additional detail below, each switch $R_{4TEFSx}$ is connected so as to further affect the amount of resistance that is included in the forward error feedback path, that is, that is connected to VCM error feedback resistor 66 (see, also, FIG. 2). Toward this end, switch $R_{4TEFS1}$ is connected between node $N_{OUT}$ and VCM error feedback resistor 66, switch $R_{4TEFS2}$ is connected between a node $N_{OUT1}$ and VCM error feedback resistor 66, switch $R_{4TEFS3}$ is connected between a node $N_{OUT2}$ and VCM error feedback resistor 66, and switch $R_{4TEFS(2N+1)}$ is connected between a node $N_{OUT(2N)}$, which is the same as node $N_{R4}$, and VCM error feedback resistor 66.

Figure 12:
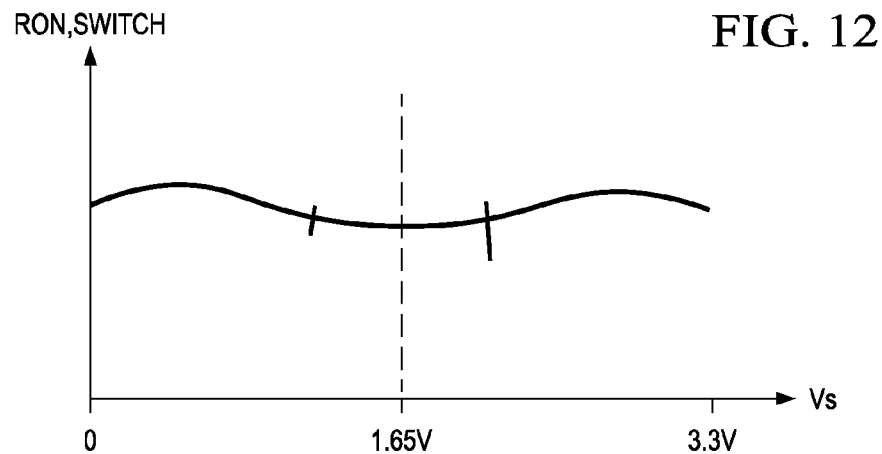
FIG. 12 illustrates the on-state resistance of the CMOS switch as a function of the voltage potential of the device source terminal.

The general operation of gain stage $GS_4$ should be appreciated by one skilled in the art given the earlier discussions, with various differences between it and previously-described gain stages now reviewed. In the preferred embodiment, only one switch in trim circuit $R_{4T}$ is closed at a time, preferably in response to a corresponding digital control signal. In this manner, therefore, depending on which of the 2N+1 switches is selected, the output node of the gain stage is selected from among nodes $N_{OUT}$ through $N_{OUT(2N)}$ and thus the overall resistance of trim circuit $R_{4T}$, as defined from its selected output node to resistor $R_4$, can be adjusted (or "trimmed"). For example, consider the instance where switch $R_{4TEFS2}$ is closed (and the other switches in trim circuit $R_{4T}$ are therefore open). In this case, rather than the output node $N_{OUT}$ of amplifier 64 being directly connected to VCM error feedback resistor 66 as with previous embodiments, instead node $N_{OUT1}$ in effect becomes the output of the gain stage and drives the forward path to VCM error feedback resistor 66. And, the output node to the forward error feedback path is effectively moved from node $N_{OUT}$ to node $N_{OUT1}$. Thus, the remaining resistance from the gain stage output of node $N_{OUT1}$, that is, the series resistance of resistors $R_{4TFSR2}$ through $R_{4TFSR(2N)}$, is added to resistor $R_4$ to adjust the gain (and CMRR) of gain stage $GS_4$, while the remaining resistance (i.e., resistor $R_{4TFSR1}$) between the output node $N_{OUT1}$ and the actual output of amplifier 64 (i.e., node $N_{OUT}$) is absorbed by the output impedance of amplifier 64. In other words, as known in the amplifier art the output impedance of amplifier 64 is highly dependent on the gain of the amplifier and, thus, in a closed loop far less influenced by any resistance connected to the output of the amplifier—hence, in this example with one resistor, or in other examples where more of the resistors in $R_{4TFSR2}$ through $R_{4TFSR(2N)}$ are connected in the closed loop path, they have minimal impact due to the output impedance of amplifier 64. Finally, note that the advantage of the approach of gain stage $GS_4$ is that there are no switches in the feedback path to resistor $R_4$ and, therefore, there is no difference in the temperature coefficient of the resistances in that feedback (i.e., as compared to an instance where a MOS channel is included in the feedback path and has a different temperature coefficient from say a polysilicon resistor in the same path). Thus, the CMRR of gain stage $GS_4$ will be less vulnerable to changes in temperature. Also in this regard, however, it is noted that an on-switch impedance is added, by the selected one of switches $R_{4TEFS1}$ through $R_{4TEFS(2N+1)}$, that is enabled at a time, into the servo control forward path to VCM error feedback resistor 66. Given this aspect, a preferred embodiment further includes a switch 70, preferably formed of the same type as switches $R_{4TEFS1}$ through $R_{4TEFS(2N+1)}$, between the output of VCM DAC 50 and resistor 54. Thus, during normal operation, symmetrical operation is achieved. Further, because the on-state resistance of the CMOS switch is a function of the voltage potential of the device source terminal, to minimize such an effect, preferably the device sizes in the switches are scaled so that such on-state resistance is relatively constant during the operation and also symmetrical with respect to $V_{ref}$ as shown in FIG. 12.

Figure 13:
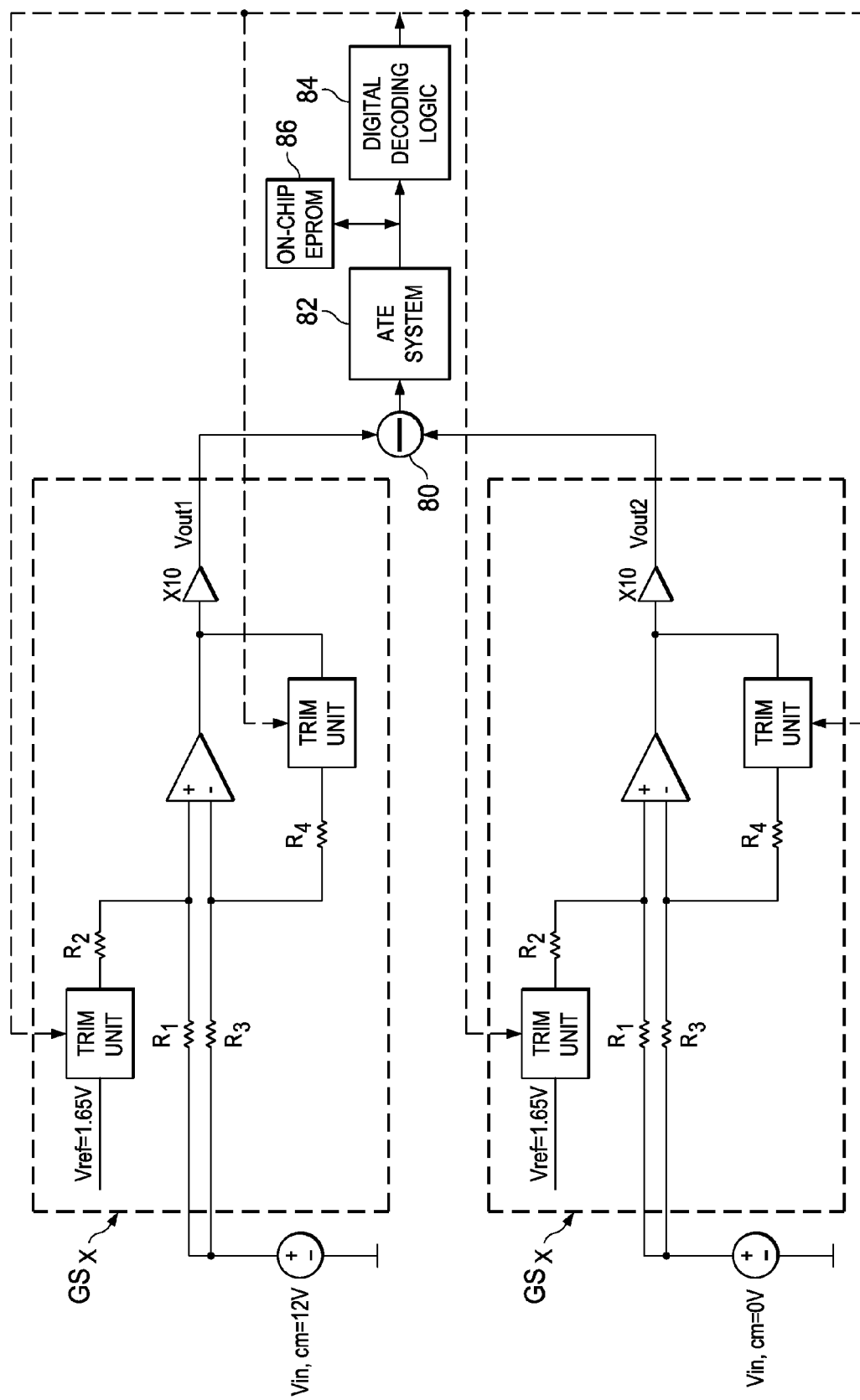
FIG. 13 illustrates a functional block diagram of a gain stage $GS_x$, which may be used either once in sequence, or duplicated as shown, to perform a preferred embodiment methodology for determining the digital control signals to desirably adjust the trim circuit(s) of the stage so as to improve their CMRR.

FIG. 13 illustrates a functional block diagram of a gain stage $GS_x$, which may be used either once in sequence, or duplicated as shown, to perform a preferred embodiment methodology for determining the digital control signals to desirably adjust the trim circuit(s) of the stage so as to reduce their CMRR. More specifically, note in FIG. 13 that the common mode voltage inputs to each illustrated stage are different, thereby suggesting that separate stages may be used as shown; alternatively, a single such stage may be operated during one period with a first voltage (e.g., $v_{in,cm}$=12 volts) and during another period with a second voltage (e.g., $v_{in,cm}$=0 volts). The respective output of each gain stage, shown as $v_{out1}$ and $v_{out2}$, may be optionally further amplified as shown such as by a factor of 10 and this amplification may be achieved by the error amplifier 56 illustrated earlier (see FIG. 2). In any event, outputs $v_{out1}$ and $v_{out2}$ are either stored such as if determined serially by a single stage, or once stored or if determined concurrently by two different stages, are connected directly to a difference determination 80. The result of difference determination 80 is connected to an automatic test equipment ("ATE") system 82, where such systems in general are known in the art yet may be programmed to further perform according to the methodology described below. ATE system 82 outputs a coded response that is provided to a digital decode logic circuit 84, and may be either concurrently or ultimately stored in a storage medium 86, such as an on-chip EPROM as shown. The output of digital decode logic circuit 84 is connected to control the trim circuit(s) of the gain stage(s) $GS_x$ (i.e., either one or two stages, depending on the various embodiments detailed above), as further detailed below.

Figure 14:
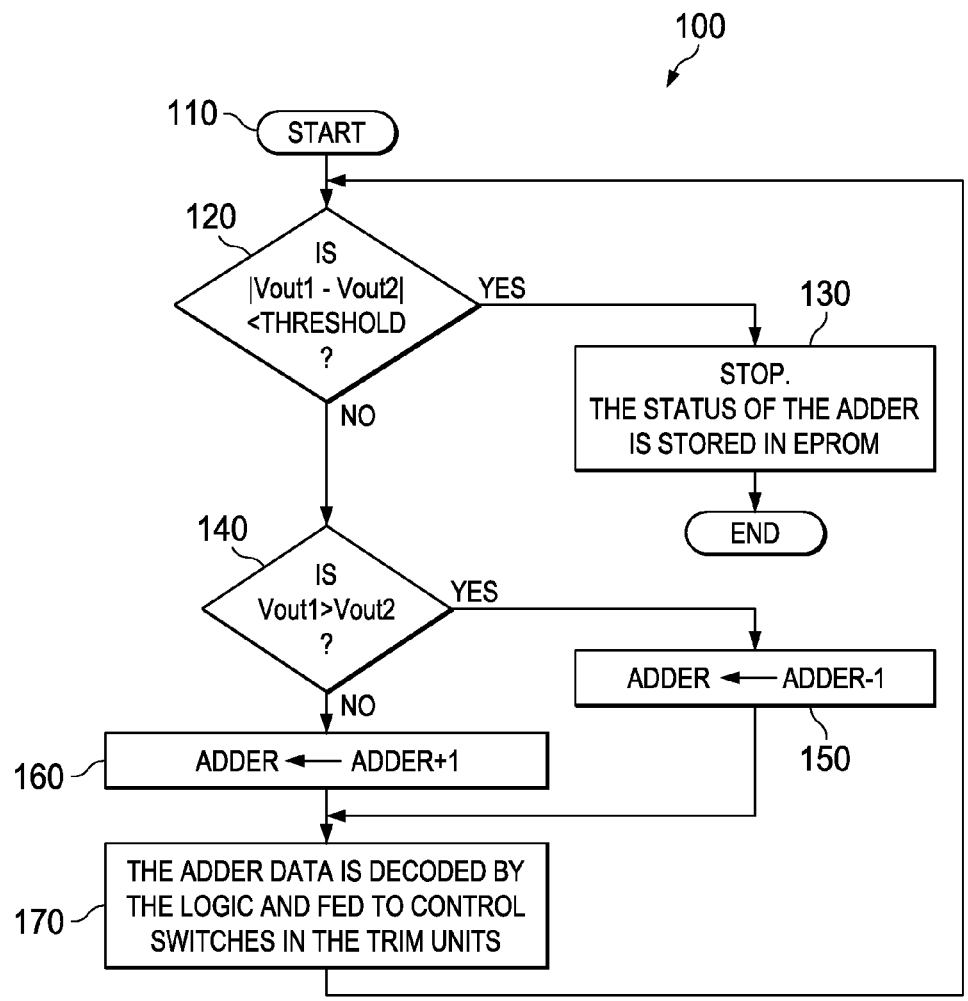
FIG. 14 illustrates a preferred embodiment methodology for adjusting the trim of a gain stage $GS_x$.

FIG. 14 illustrates a preferred embodiment methodology for adjusting the trim of a gain stage $GS_x$, as may be achieved using the configuration from FIG. 13. Method 100 starts at a step 110, where the flow proceeds to step 120 and for two different initial values of $v_{in,cm}$, the two respective output voltages, shown as $v_{out1}$ and $v_{out2}$, are subtracted from one another by difference determination 80. Also in step 120, the absolute value of the difference between $v_{out1}$ and $v_{out2}$ is compared to a threshold. If the difference is below the threshold, then method 100 continues from step 120 to step 130, whereas if the difference is not below the threshold, then method 100 continues from step 120 to step 140. Additionally, note that the threshold may be established by one skilled in the art as corresponding to a value that provides a sufficiently desirable CMRR for the gain stage at issue, as further appreciated below.

In step 130, having been reached because the absolute value of the difference between $v_{out1}$ and $v_{out2}$ is below the established threshold, then method 100 in effect concludes that the trim values used for providing the outputs analyzed in step 120 have provided a sufficiently desirable CMRR. As a result, those trim values are stored in storage medium 86 (e.g., on-chip EPROM). Thereafter, method 100 concludes as the stored values are thereafter usable to control the gain stage to operate at the desired CMRR.

In step 140, having been reached because the absolute value of the difference between $v_{out1}$ and $v_{out2}$ is above (or in the example equal to) the established threshold, then method step 140 in effect determines which of the outputs, $v_{out1}$ and $v_{out2}$, corresponding respectively to a relatively higher common-mode input voltage (e.g., 12V) and a relatively lower common-mode input voltage (e.g., 0V), is higher. Thus, if $v_{out1}$ exceeds $v_{out2}$, then method 100 continues from step 140 to a step 150, whereas is if $v_{out1}$ does not exceed $v_{out2}$, then method 100 continues from step 140 to a step 160.

Steps 150 and 160 make an appropriate adjustment to an ATE encoder, which may be established as a 4-bit adder (which also is operable to subtract) in which the MSB is the sign bit. Specifically, based on the relative values of $v_{out1}$ and $v_{out2}$ and with the control as described above, either step 160 increments the adder value or step 150 decrements the adder value, thereby corresponding to an adjustment to be used in another iteration in controlling the gain stage trim circuit(s). Thus, following either step 150 or step 160, method 100 continues to step 170, at which point digital decoding logic 84 decodes the adder value into an appropriate control signal for the gain stage trim circuit(s). Thereafter, method 100 returns to step 110 at which point new values of values of $v_{out1}$ and $v_{out2}$ are determined, and the process repeats. From the above, one skilled in the art will appreciate that method 100 thereby continues to repeat until the difference between the values of $v_{out1}$ and $v_{out2}$ is below the desired threshold, thereby at that point storing the ATE encode value in storage medium 86. Once this below-threshold value is stored, it is thereafter decoded when needed so as to control the trim circuit(s) of the gain stage. In any event, therefore, the determined control values are able to trim the desired trim circuit $R_{4T}$ and possibly also trim circuit $R_{2T}$ with the goal of improving the CMRR of the gain stage and providing an improved system in which that stage is implemented.

From the preceding, it may be appreciated that the preferred embodiments provide a gain stages and more specifically a single-ended gain stage such as for use with a disk drive and related data or computing system, where the CMRR of the gain stage is improved over the prior art and such improvement may be done with far less use of area on the integrated circuit that includes the gain stage. Numerous embodiments are provided, all of which include an amplifier and a stage output node, and from that stage output node there is a gain stage feedback path that includes a first electrically-controllable resistance path (e.g., controlling a variable resistance that is adjusted by a digital control signal that controls one or more switches), and also that stage output node may be connected in a forward feedback path in a larger closed loop system (e.g., in a servo loop control loop through a VCM error feedback resistor 66 to the inverting input of amplifier 56). Moreover, in certain illustrated embodiments, the gain stage also includes a biasing reference voltage coupled through a second electrically-controllable resistance path (e.g., also controlling a variable resistance that is adjusted by a digital control signal that controls one or more switches). Accordingly, the resistance of the first, or both the first and second, electrically-controllable resistance paths may be adjusted, and in the preferred embodiments the adjustments are for establishing a ratio between those paths that is favorable with respect to other paths relating to the amplifier. Indeed, in the preferred embodiments, one of the electrically-controllable resistance paths is coupled to one input (e.g., +) of the amplifier and the other of the electrically-controllable resistance paths is coupled to another input (e.g., −) of the amplifier, where each of those inputs is also coupled to additional resistance paths and the electrically-controllable resistance paths are adjusted in view of the resistance, or ratio of such resistance, of those additional resistance paths. As a result, CMRR is improved and various related benefits are achieved. Further, note that various embodiments are provided with different variations consistent with the above. Thus, these embodiments also demonstrate that while the present embodiments have been described in detail, various substitutions, modifications or alterations could be made to the descriptions set forth above without departing from the inventive scope, as is defined by the following claims.

The invention claimed is:

1. An electrical apparatus, comprising:
    an amplifier having a first input, a second input, and an output;
    a first electrical path coupled to the first input and having a first resistance;
    a first electrical path coupled to the second input and having a second resistance;
    a second electrical path coupled to the second input and having a third resistance;
    a second electrical path, comprising an electrically-controllable resistance, coupled between the output and the first input; and
    circuitry for controlling the electrically-controllable resistance for adjusting a ratio between the electrically-controllable resistance and the third resistance to approximate a ratio between the first resistance and the second resistance;

wherein the circuitry for controlling the electrically-controllable resistance comprises circuitry for applying a digital control signal to switches.

2. The electrical apparatus of claim 1 wherein the third resistance of the second electrical path comprises an electrically-controllable resistance.

3. The electrical apparatus of claim 2 wherein the second electrical path coupled to the second input is for receiving a reference voltage.

4. The electrical apparatus of claim 2 wherein the electrically-controllable resistance of the second electrical paths comprises switches.

5. The electrical apparatus of claim 2 wherein the electrically-controllable resistance of each of the second electrical paths comprises:
   an integer number of resistors connected in series; and
   an integer number of switches connected in series, wherein each switch in the integer number of switches is connected in parallel to a different resistor in the integer number of resistors.

6. The electrical apparatus of claim 5 wherein the integer number is the same for the second electrical path coupled between the output and the first input and the second electrical path coupled to the second input.

7. The electrical apparatus of claim 5 wherein the electrically-controllable resistance of each of the second electrical paths further comprises a fixed resistance resistor.

8. The electrical apparatus of claim 2 wherein the electrically-controllable resistance of the second electrical paths comprises:
   an integer number of resistors connected in series; and
   an integer number of switched-resistor combinations connected in series, wherein each switched-resistor combination in the integer number of switched-resistor combinations is connected in parallel to a different resistor in the integer number of resistors and comprises a switch coupled in series with resistor.

9. The electrical apparatus of claim 8 wherein the integer number is the same for the second electrical path coupled between the output and the first input and the second electrical path coupled to the second input.

10. The electrical apparatus of claim 8 wherein the electrically-controllable resistance of each of the second electrical paths further comprises a fixed resistance resistor.

11. The electrical apparatus of claim 2 wherein the electrically-controllable resistance of each of the second electrical paths comprises:
    a fixed resistance resistor; and
    an integer number of switched-resistor combinations connected in parallel and in parallel with the fixed resistance resistor, wherein each switched-resistor combination comprises a switch coupled in series with a resistor.

12. The electrical apparatus of claim 11 wherein the integer number is the same for the second electrical path coupled between the output and the first input and the second electrical path coupled to the second input.

13. The electrical apparatus of claim 11 wherein the electrically-controllable resistance of the second electrical paths further comprises a fixed resistance resistor.

14. The electrical apparatus of claim 1 wherein the second electrical path coupled between the output and the first input comprises an integer number of resistors connected in series, and further comprising:

a node coupling to a feedback path in a control loop; and
a number of switches, equal to the integer number plus one;
   wherein a first switch in the number of switches is connected between the node and the output; and
   wherein each switch in the number of switches, other than the first switch, is connected between the node and a node between a different respective pair of the integer number of resistors.

15. The electrical apparatus of claim 14 and further comprising circuitry for enabling only one switch in the number of switches at a time.

16. The electrical apparatus of claim 14 wherein the electrically-controllable resistance of the second electrical path further comprises a fixed resistance resistor.

17. The electrical apparatus of claim 1 wherein the circuitry for controlling the electrically-controllable resistance comprises circuitry for applying a digital control signal to switches.

18. The apparatus of claim 1 and further comprising a motor for receiving an operating voltage in response to a signal at the output of the amplifier.

19. The apparatus of claim 18 and further comprising:
    at least one magnetic storage medium; and
    an electro-mechanical mechanism for reading data from, and writing data to, the at least one magnetic storage medium; and
    means for positioning the electro-mechanical mechanism in response to operation of the motor.

20. The apparatus of claim 18 wherein the at least one magnetic storage medium comprises a data disk.

21. An electrical apparatus, comprising:
    an amplifier having a first input, a second input, and an output;
    a first electrical path coupled to the first input and having a first resistance;
    a first electrical path coupled to the second input and having a second resistance;
    a second electrical path coupled to the second input and having a third resistance;
    a second electrical path, comprising an electrically-controllable resistance, coupled between the output and the first input; and
    circuitry for controlling the electrically-controllable resistance for adjusting a ratio between the electrically-controllable resistance and the third resistance to approximate a ratio between the first resistance and the second resistance, wherein
       the third resistance of the second electrical path comprises an electrically-controllable resistance,
       the electrically-controllable resistance of the second electrical paths comprises switches, and
       the circuitry for controlling comprises circuitry for providing digital signals to control open and closing of the switches.

22. The electrical apparatus of claim 21 wherein the switches comprise CMOS transmission gates.

23. An electrical apparatus comprising:
    an operational amplifier having an inverting input and a non-inverting input;
    a first electrical path comprising a first resistance coupled between the non-inverting input and a first input of the electrical apparatus;

a second electrical path comprising a second resistance coupled between the inverting input and a second input of the electrical apparatus;

a third electrical path comprising a first electrically controllable resistance coupled between the non-inverting input and a third input of the electrical apparatus;

a fourth electrical path comprising a second electronically controlled resistance, coupled between the inverting input and an output of electrical apparatus; and circuitry for controlling the first and second electronically controllable resistances wherein a ratio between the first resistance and the second resistance is approximately equal to a ratio between the first electronically controllable resistance and the second electronically controllable resistance.

24. The electrical apparatus of claim 23 wherein the third input is for receiving a reference voltage.

25. The electrical apparatus of claim 23 wherein the electronically controllable resistances comprises switches.

* * * * *